United States Patent
Rajan et al.

(10) Patent No.: US 8,130,560 B1
(45) Date of Patent: Mar. 6, 2012

(54) MULTI-RANK PARTIAL WIDTH MEMORY MODULES

(75) Inventors: Suresh Natarajan Rajan, San Jose, CA (US); Michael John Sebastian Smith, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 11/939,432

(22) Filed: Nov. 13, 2007

Related U.S. Application Data

(60) Provisional application No. 60/865,623, filed on Nov. 13, 2006.

(51) Int. Cl.
*G11C 7/00* (2006.01)
(52) U.S. Cl. .................. 365/189.03; 365/63; 365/189.18
(58) Field of Classification Search .............. 365/189.03
See application file for complete search history.

(56) References Cited

U.S. PATENT DOCUMENTS

| | | |
|---|---|---|
| 3,800,292 A | 3/1974 | Curley et al. |
| 4,069,452 A | 1/1978 | Conway et al. |
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. ............. 365/230 |
| 4,525,921 A | 7/1985 | Carson et al. ................... 29/577 |
| 4,566,082 A | 1/1986 | Anderson |
| 4,592,019 A | 5/1986 | Huang et al. .................... 365/78 |
| 4,646,128 A | 2/1987 | Carson et al. ................... 357/74 |
| 4,698,748 A | 10/1987 | Juzswik et al. ............... 364/200 |
| 4,706,166 A | 11/1987 | Go ................................. 361/403 |
| 4,710,903 A | 12/1987 | Hereth et al. ................. 365/194 |
| 4,764,846 A | 8/1988 | Go ................................. 361/388 |
| 4,780,843 A | 10/1988 | Tietjen .......................... 364/900 |
| 4,794,597 A | 12/1988 | Ooba et al. |
| 4,796,232 A | 1/1989 | House .......................... 365/189 |
| 4,807,191 A | 2/1989 | Flannagan |
| 4,841,440 A | 6/1989 | Yonezu et al. ................ 364/200 |
| 4,862,347 A | 8/1989 | Rudy |
| 4,884,237 A | 11/1989 | Mueller et al. ................... 365/63 |
| 4,887,240 A | 12/1989 | Garverick et al. ............. 361/222 |
| 4,888,687 A | 12/1989 | Allison et al. |
| 4,899,107 A | 2/1990 | Corbett et al. ................ 324/158 |
| 4,912,678 A | 3/1990 | Mashiko |
| 4,922,451 A | 5/1990 | Lo et al. |
| 4,935,734 A | 6/1990 | Austin ..................... 340/825.83 |

(Continued)

FOREIGN PATENT DOCUMENTS

DE 102004051345 5/2006

(Continued)

OTHER PUBLICATIONS

Office Action from U.S. Appl. No. 11/461,427 mailed on Sep. 5, 2008.

(Continued)

*Primary Examiner* — Tan T. Nguyen
(74) *Attorney, Agent, or Firm* — Fish & Richardson P.C.

(57) ABSTRACT

A system is provided for multi-rank, partial-width memory modules. A memory controller is provided. Additionally, a memory bus is provided. Further, a memory module with a plurality of ranks of memory circuits is provided, the memory module including a first number of data pins that is less than a second number of data pins of the memory bus.

30 Claims, 11 Drawing Sheets

U.S. PATENT DOCUMENTS

| | | | | |
|---|---|---|---|---|
| 4,937,791 | A | 6/1990 | Steele et al. | |
| 4,956,694 | A | 9/1990 | Eide | |
| 4,982,265 | A | 1/1991 | Watanabe et al. | 357/75 |
| 4,983,533 | A | 1/1991 | Go | 437/7 |
| 5,025,364 | A | 6/1991 | Zellmer | |
| 5,072,424 | A | 12/1991 | Brent et al. | 365/189 |
| 5,083,266 | A | 1/1992 | Watanabe | 395/275 |
| 5,104,820 | A | 4/1992 | Go et al. | 437/51 |
| 5,193,072 | A | 3/1993 | Frenkil et al. | |
| 5,212,666 | A * | 5/1993 | Takeda | 365/230.03 |
| 5,220,672 | A | 6/1993 | Nakao et al. | 395/750 |
| 5,241,266 | A | 8/1993 | Ahmad et al. | 324/158 |
| 5,252,807 | A | 10/1993 | Chizinsky | 219/390 |
| 5,257,233 | A | 10/1993 | Schaefer | 365/227 |
| 5,278,796 | A | 1/1994 | Tillinghast et al. | 365/211 |
| 5,282,177 | A | 1/1994 | McLaury | 365/230 |
| 5,332,922 | A | 7/1994 | Oguchi et al. | 257/723 |
| 5,347,428 | A | 9/1994 | Carson et al. | 361/760 |
| 5,384,745 | A | 1/1995 | Konishi et al. | 365/230.03 |
| 5,388,265 | A | 2/1995 | Volk | 395/750 |
| 5,390,334 | A | 2/1995 | Harrison | |
| 5,408,190 | A | 4/1995 | Wood et al. | 324/765 |
| 5,432,729 | A | 7/1995 | Carson et al. | 365/63 |
| 5,448,511 | A | 9/1995 | Paurus et al. | 365/52 |
| 5,453,434 | A | 9/1995 | Albaugh et al. | 514/397 |
| 5,467,455 | A | 11/1995 | Gay et al. | 395/281 |
| 5,483,497 | A | 1/1996 | Mochizuki et al. | |
| 5,498,886 | A | 3/1996 | Hsu et al. | 257/213 |
| 5,502,333 | A | 3/1996 | Bertin et al. | |
| 5,502,667 | A | 3/1996 | Bertin et al. | 365/51 |
| 5,513,135 | A | 4/1996 | Dell et al. | |
| 5,513,339 | A | 4/1996 | Agrawal et al. | |
| 5,519,832 | A | 5/1996 | Warchol | |
| 5,526,320 | A | 6/1996 | Zagar et al. | 365/233 |
| 5,530,836 | A | 6/1996 | Busch et al. | 395/477 |
| 5,550,781 | A | 8/1996 | Sugawara et al. | |
| 5,559,990 | A | 9/1996 | Cheng et al. | 395/484 |
| 5,561,622 | A | 10/1996 | Bertin et al. | 365/51 |
| 5,563,086 | A | 10/1996 | Bertin et al. | 437/52 |
| 5,566,344 | A | 10/1996 | Hall et al. | 395/800 |
| 5,581,498 | A | 12/1996 | Ludwig et al. | 365/63 |
| 5,581,779 | A | 12/1996 | Hall et al. | 395/800 |
| 5,590,071 | A | 12/1996 | Kolor et al. | 365/149 |
| 5,598,376 | A | 1/1997 | Merritt et al. | 365/230 |
| 5,604,714 | A | 2/1997 | Manning et al. | 365/230 |
| 5,606,710 | A | 2/1997 | Hall et al. | 395/800 |
| 5,608,262 | A | 3/1997 | Degani et al. | |
| 5,610,864 | A | 3/1997 | Manning | 365/193 |
| 5,623,686 | A | 4/1997 | Hall et al. | 395/800 |
| 5,627,791 | A | 5/1997 | Wright et al. | 365/222 |
| 5,640,337 | A | 6/1997 | Huang et al. | 364/578 |
| 5,640,364 | A | 6/1997 | Merritt et al. | 365/233 |
| 5,652,724 | A | 7/1997 | Manning | 365/189 |
| 5,654,204 | A | 8/1997 | Anderson | 438/15 |
| 5,661,677 | A | 8/1997 | Rondeau et al. | 365/63 |
| 5,661,695 | A | 8/1997 | Zagar et al. | 365/233 |
| 5,668,773 | A | 9/1997 | Zagar et al. | 365/233 |
| 5,675,549 | A | 10/1997 | Ong et al. | 365/233 |
| 5,680,342 | A | 10/1997 | Frankeny | 365/52 |
| 5,682,354 | A | 10/1997 | Manning | 365/233 |
| 5,692,121 | A | 11/1997 | Bozso et al. | |
| 5,692,202 | A | 11/1997 | Kardach et al. | 395/750 |
| 5,696,732 | A | 12/1997 | Zagar et al. | 365/233 |
| 5,702,984 | A | 12/1997 | Bertin et al. | 437/208 |
| 5,703,813 | A | 12/1997 | Manning et al. | 365/189 |
| 5,706,247 | A | 1/1998 | Merritt et al. | 365/233 |
| RE35,733 | E | 2/1998 | Hernandez et al. | |
| 5,717,654 | A | 2/1998 | Manning | 365/233 |
| 5,721,859 | A | 2/1998 | Manning | 397/421 |
| 5,724,288 | A | 3/1998 | Cloud et al. | 365/193 |
| 5,729,503 | A | 3/1998 | Manning | 365/233 |
| 5,729,504 | A | 3/1998 | Cowles | 365/236 |
| 5,742,792 | A | 4/1998 | Yanai et al. | |
| 5,748,914 | A | 5/1998 | Barth et al. | 395/285 |
| 5,752,045 | A | 5/1998 | Chen | 395/750 |
| 5,757,703 | A | 5/1998 | Merritt et al. | 365/189 |
| 5,760,478 | A | 6/1998 | Bozso et al. | |
| 5,761,703 | A | 6/1998 | Bolyn | 711/106 |
| 5,781,766 | A | 7/1998 | Davis | 395/552 |
| 5,787,457 | A | 7/1998 | Miller et al. | |
| 5,798,961 | A | 8/1998 | Heyden et al. | 365/52 |
| 5,802,010 | A | 9/1998 | Zagar et al. | 365/233 |
| 5,802,395 | A | 9/1998 | Connolly et al. | |
| 5,802,555 | A | 9/1998 | Shigeeda | 711/106 |
| 5,812,488 | A | 9/1998 | Zagar et al. | 365/233 |
| 5,819,065 | A | 10/1998 | Chilton et al. | |
| 5,831,833 | A | 11/1998 | Shirakawa et al. | |
| 5,831,931 | A | 11/1998 | Manning | 365/233 |
| 5,831,932 | A | 11/1998 | Merritt et al. | 365/233 |
| 5,834,838 | A | 11/1998 | Anderson | 257/697 |
| 5,835,435 | A | 11/1998 | Bogin et al. | 365/22 |
| 5,838,165 | A | 11/1998 | Chatter | |
| 5,838,177 | A | 11/1998 | Keeth | 327/108 |
| 5,841,580 | A | 11/1998 | Farmwald et al. | 365/194 |
| 5,843,799 | A | 12/1998 | Hsu et al. | 438/6 |
| 5,843,807 | A | 12/1998 | Burns | 438/109 |
| 5,845,108 | A | 12/1998 | Yoo et al. | 395/551 |
| 5,847,450 | A * | 12/1998 | Fink et al. | 257/697 |
| 5,850,368 | A | 12/1998 | Ong et al. | 365/238 |
| 5,859,792 | A | 1/1999 | Rondeau et al. | 365/52 |
| 5,860,106 | A | 1/1999 | Domen et al. | 711/137 |
| 5,870,347 | A | 2/1999 | Keeth et al. | 365/230 |
| 5,870,350 | A * | 2/1999 | Bertin et al. | 365/233.11 |
| 5,872,907 | A | 2/1999 | Griess et al. | |
| 5,875,142 | A | 2/1999 | Chevallier | 365/212 |
| 5,878,279 | A | 3/1999 | Athenes | |
| 5,884,088 | A | 3/1999 | Kardach et al. | 395/750.06 |
| 5,901,105 | A | 5/1999 | Ong et al. | 365/230.06 |
| 5,903,500 | A | 5/1999 | Tsang et al. | 365/189.05 |
| 5,905,688 | A | 5/1999 | Park | 365/227 |
| 5,907,512 | A | 5/1999 | Parkinson et al. | 365/195 |
| 5,913,072 | A | 6/1999 | Wieringa | |
| 5,915,105 | A | 6/1999 | Farmwald et al. | 395/309 |
| 5,915,167 | A | 6/1999 | Leedy | |
| 5,917,758 | A | 6/1999 | Keeth | 365/189.05 |
| 5,923,611 | A | 7/1999 | Ryan | 365/233 |
| 5,924,111 | A | 7/1999 | Huang et al. | |
| 5,926,435 | A | 7/1999 | Park et al. | |
| 5,929,650 | A | 7/1999 | Pappert et al. | 324/763 |
| 5,943,234 | A | 8/1999 | Martinez et al. | 364/468.03 |
| 5,943,254 | A | 8/1999 | Bakeman, Jr. et al. | |
| 5,946,265 | A | 8/1999 | Cowles | 365/233 |
| 5,949,254 | A | 9/1999 | Keeth | 326/87 |
| 5,953,215 | A | 9/1999 | Karabatsos | 361/767 |
| 5,953,263 | A | 9/1999 | Farmwald et al. | 365/194 |
| 5,954,804 | A | 9/1999 | Farmwald et al. | 710/36 |
| 5,956,233 | A | 9/1999 | Yew et al. | 361/760 |
| 5,962,435 | A | 10/1999 | Mao et al. | 514/63 |
| 5,963,429 | A | 10/1999 | Chen | |
| 5,963,463 | A | 10/1999 | Rondeau et al. | 365/52 |
| 5,963,464 | A | 10/1999 | Dell et al. | |
| 5,963,504 | A | 10/1999 | Manning | 365/233 |
| 5,966,724 | A | 10/1999 | Ryan | 711/105 |
| 5,966,727 | A | 10/1999 | Nishino | 711/127 |
| 5,969,996 | A | 10/1999 | Muranaka et al. | 365/189.01 |
| 5,973,392 | A | 10/1999 | Senba et al. | 257/686 |
| 5,995,424 | A | 11/1999 | Lawrence et al. | |
| 5,995,443 | A | 11/1999 | Farmwald et al. | 365/233 |
| 6,001,671 | A | 12/1999 | Fjelstad | |
| 6,002,613 | A | 12/1999 | Cloud et al. | 365/189 |
| 6,002,627 | A | 12/1999 | Chevallier | 365/212 |
| 6,014,339 | A | 1/2000 | Kobayashi et al. | 365/233 |
| 6,016,282 | A | 1/2000 | Keeth | 365/233 |
| 6,026,050 | A | 2/2000 | Baker et al. | 365/233 |
| 6,029,250 | A | 2/2000 | Keeth | 713/400 |
| 6,032,214 | A | 2/2000 | Farmwald et al. | 710/129 |
| 6,032,215 | A | 2/2000 | Farmwald et al. | 710/129 |
| 6,034,916 | A | 3/2000 | Lee | 365/233 |
| 6,034,918 | A | 3/2000 | Farmwald et al. | 365/233 |
| 6,035,365 | A | 3/2000 | Farmwald et al. | 710/129 |
| 6,038,195 | A | 3/2000 | Farmwald et al. | 365/233 |
| 6,038,673 | A | 3/2000 | Benn et al. | 713/323 |
| 6,044,032 | A | 3/2000 | Li | 365/230 |
| 6,047,073 | A | 4/2000 | Norris et al. | |
| 6,047,344 | A | 4/2000 | Kawasumi et al. | 710/107 |
| 6,053,948 | A | 4/2000 | Vaidyanathan et al. | 703/14 |
| 6,058,451 | A | 5/2000 | Bermingham et al. | |

| | | | |
|---|---|---|---|
| 6,069,504 A | 5/2000 | Keeth .................................. 327/108 |
| 6,070,217 A | 5/2000 | Connolly et al. ............ 710/131 |
| 6,073,223 A | 6/2000 | McAllister et al. ........... 711/167 |
| 6,075,730 A | 6/2000 | Barth et al. ................... 365/191 |
| 6,075,744 A | 6/2000 | Tsern et al. ................... 365/230 |
| 6,078,546 A | 6/2000 | Lee ............................... 365/233 |
| 6,079,025 A | 6/2000 | Fung ............................. 713/323 |
| 6,084,434 A | 7/2000 | Keeth ............................ 326/87 |
| 6,088,290 A | 7/2000 | Ohtake et al. ................. 365/233 |
| 6,091,251 A | 7/2000 | Wood et al. ................... 324/755 |
| RE36,839 E | 8/2000 | Simmons et al. ............. 326/93 |
| 6,101,152 A | 8/2000 | Farmwald et al. ............ 365/233 |
| 6,101,564 A | 8/2000 | Athenes et al. |
| 6,101,612 A | 8/2000 | Jeddeloh ........................ 713/401 |
| 6,108,795 A | 8/2000 | Jeddeloh ........................ 713/401 |
| 6,111,812 A | 8/2000 | Gans et al. .................... 365/233 |
| 6,134,638 A | 10/2000 | Olarig et al. .................. 711/167 |
| 6,154,370 A | 11/2000 | Degani et al. |
| 6,166,991 A | 12/2000 | Phelan ........................... 365/233 |
| 6,182,184 B1 | 1/2001 | Farmwald et al. ............ 710/129 |
| 6,199,151 B1 | 3/2001 | Williams et al. |
| 6,208,168 B1 | 3/2001 | Rhee ............................. 326/83 |
| 6,216,246 B1 | 4/2001 | Shau ............................. 714/763 |
| 6,222,739 B1 | 4/2001 | Bhakta et al. |
| 6,226,709 B1 | 5/2001 | Goodwin et al. |
| 6,233,192 B1 | 5/2001 | Tanaka |
| 6,233,650 B1* | 5/2001 | Johnson et al. ................. 711/5 |
| 6,240,048 B1 | 5/2001 | Matsubara ..................... 365/233 |
| 6,243,282 B1 | 6/2001 | Rondeau et al. .............. 365/52 |
| 6,252,807 B1 | 6/2001 | Suzuki et al. |
| 6,260,097 B1 | 7/2001 | Farmwald et al. ............ 710/129 |
| 6,260,154 B1 | 7/2001 | Jeddeloh ........................ 713/401 |
| 6,262,938 B1 | 7/2001 | Lee et al. ....................... 365/233 |
| 6,266,285 B1 | 7/2001 | Farmwald et al. ............ 365/194 |
| 6,266,292 B1 | 7/2001 | Tsern et al. .................... 365/230 |
| 6,274,395 B1 | 8/2001 | Weber ........................... 438/14 |
| 6,279,069 B1 | 8/2001 | Robinson et al. ............. 711/103 |
| 6,295,572 B1 | 9/2001 | Wu ................................ 710/131 |
| 6,298,426 B1 | 10/2001 | Ajanovic ....................... 711/172 |
| 6,304,511 B1 | 10/2001 | Gans et al. .................... 365/233 |
| 6,307,769 B1 | 10/2001 | Nuxoll et al. ................. 365/63 |
| 6,314,051 B1 | 11/2001 | Farmwald et al. ............ 365/233 |
| 6,317,352 B1 | 11/2001 | Halbert et al. ................ 365/52 |
| 6,317,381 B1 | 11/2001 | Gans et al. .................... 365/233 |
| 6,324,120 B2 | 11/2001 | Farmwald et al. ............ 365/233 |
| 6,326,810 B1 | 12/2001 | Keeth ............................ 326/83 |
| 6,327,664 B1 | 12/2001 | Dell et al. ...................... 713/323 |
| 6,330,683 B1 | 12/2001 | Jeddeloh ........................ 713/401 |
| 6,336,174 B1 | 1/2002 | Li et al. |
| 6,338,108 B1 | 1/2002 | Motomura ..................... 710/110 |
| 6,338,113 B1 | 1/2002 | Kubo et al. .................... 711/105 |
| 6,341,347 B1 | 1/2002 | Joy et al. ....................... 712/228 |
| 6,343,019 B1 | 1/2002 | Jiang et al. |
| 6,343,042 B1 | 1/2002 | Tsern et al. .................... 365/222 |
| 6,353,561 B1 | 3/2002 | Funyu et al. ................... 365/195 |
| 6,356,105 B1 | 3/2002 | Volk .............................. 326/30 |
| 6,356,500 B1 | 3/2002 | Cloud et al. ................... 365/226 |
| 6,362,656 B2 | 3/2002 | Rhee ............................. 326/87 |
| 6,363,031 B2 | 3/2002 | Phelan ........................... 365/233 |
| 6,378,020 B2 | 4/2002 | Farmwald et al. ............ 710/129 |
| 6,381,188 B1 | 4/2002 | Choi et al. ..................... 365/222 |
| 6,381,668 B1 | 4/2002 | Lunteren ........................ 711/5 |
| 6,389,514 B1 | 5/2002 | Rokicki |
| 6,392,304 B1 | 5/2002 | Butler |
| 6,414,868 B1 | 7/2002 | Wong et al. ................... 365/51 |
| 6,418,034 B1 | 7/2002 | Weber et al. |
| 6,418,035 B1 | 7/2002 | Yu .................................. 361/809 |
| 6,421,754 B1 | 7/2002 | Kau et al. |
| 6,424,532 B2 | 7/2002 | Kawamura |
| 6,426,916 B2 | 7/2002 | Farmwald et al. ............ 365/233 |
| 6,429,029 B1 | 8/2002 | Eldridge et al. ............... 438/14 |
| 6,430,103 B2 | 8/2002 | Nakayama et al. ....... 365/230.03 |
| 6,437,600 B1 | 8/2002 | Keeth ............................ 326/86 |
| 6,438,057 B1 | 8/2002 | Ruckerbauer ................. 365/222 |
| 6,442,698 B2 | 8/2002 | Nizar ............................. 713/320 |
| 6,445,591 B1 | 9/2002 | Kwong |
| 6,452,826 B1 | 9/2002 | Kim et al. ...................... 365/51 |
| 6,452,863 B2 | 9/2002 | Farmwald et al. ............ 365/233 |
| 6,453,400 B1 | 9/2002 | Maesako et al. .............. 711/167 |
| 6,453,402 B1 | 9/2002 | Jeddeloh ........................ 711/167 |
| 6,453,434 B2 | 9/2002 | Delp et al. |
| 6,455,348 B1 | 9/2002 | Yamaguchi |
| 6,457,095 B1 | 9/2002 | Volk .............................. 711/105 |
| 6,459,651 B1 | 10/2002 | Lee et al. ....................... 365/233 |
| 6,473,831 B1 | 10/2002 | Schade .......................... 711/115 |
| 6,476,476 B1 | 11/2002 | Glenn |
| 6,480,929 B1 | 11/2002 | Gauthier et al. .............. 711/105 |
| 6,487,102 B1 | 11/2002 | Halbert et al. ................ 365/51 |
| 6,489,669 B2 | 12/2002 | Shimada et al. |
| 6,490,161 B1 | 12/2002 | Johnson |
| 6,492,726 B1 | 12/2002 | Quek et al. |
| 6,493,789 B2 | 12/2002 | Ware et al. .................... 711/105 |
| 6,496,440 B2 | 12/2002 | Manning ................... 365/230.03 |
| 6,496,897 B2 | 12/2002 | Ware et al. .................... 711/105 |
| 6,498,766 B2 | 12/2002 | Lee et al. ....................... 365/233 |
| 6,510,097 B2 | 1/2003 | Fukuyama ................ 365/230.03 |
| 6,510,503 B2 | 1/2003 | Gillingham et al. .......... 711/167 |
| 6,512,392 B2 | 1/2003 | Fleury et al. .................. 324/765 |
| 6,521,984 B2 | 2/2003 | Matsuura |
| 6,526,471 B1 | 2/2003 | Shimomura et al. ........... 711/5 |
| 6,526,473 B1* | 2/2003 | Kim ............................... 711/105 |
| 6,526,484 B1 | 2/2003 | Stacovsky et al. ............ 711/158 |
| 6,545,895 B1 | 4/2003 | Li et al. .......................... 365/52 |
| 6,546,446 B2 | 4/2003 | Farmwald et al. ............ 710/305 |
| 6,553,450 B1 | 4/2003 | Dodd et al. .................... 711/105 |
| 6,560,158 B2 | 5/2003 | Choi et al. ..................... 365/226 |
| 6,563,337 B2 | 5/2003 | Dour ............................. 326/30 |
| 6,563,759 B2 | 5/2003 | Yahata et al. .................. 365/233 |
| 6,564,281 B2 | 5/2003 | Farmwald et al. ............ 710/305 |
| 6,564,285 B1 | 5/2003 | Mills et al. .................... 711/103 |
| 6,574,150 B2 | 6/2003 | Suyama et al. ........... 365/189.05 |
| 6,584,037 B2 | 6/2003 | Farmwald et al. ............ 365/233 |
| 6,587,912 B2 | 7/2003 | Leddige et al. ................. 711/5 |
| 6,590,822 B2 | 7/2003 | Hwang et al. ................ 365/222 |
| 6,594,770 B1 | 7/2003 | Sato et al. ...................... 713/320 |
| 6,597,616 B2 | 7/2003 | Tsern et al. .................... 365/222 |
| 6,597,617 B2 | 7/2003 | Ooishi et al. |
| 6,614,700 B2 | 9/2003 | Dietrich et al. ............... 365/194 |
| 6,618,267 B1 | 9/2003 | Dalal et al. |
| 6,618,791 B1 | 9/2003 | Dodd et al. .................... 711/105 |
| 6,621,760 B1 | 9/2003 | Ahmad et al. ................. 365/233 |
| 6,630,729 B2 | 10/2003 | Huang |
| 6,631,086 B1 | 10/2003 | Bill et al. .................. 365/185.09 |
| 6,639,820 B1 | 10/2003 | Khandekar et al. ........... 365/63 |
| 6,646,939 B2 | 11/2003 | Kwak |
| 6,650,588 B2 | 11/2003 | Yamagata ...................... 365/222 |
| 6,650,594 B1 | 11/2003 | Lee et al. ....................... 365/233 |
| 6,657,634 B1 | 12/2003 | Sinclair et al. |
| 6,657,918 B2 | 12/2003 | Foss et al. ...................... 365/233 |
| 6,657,919 B2 | 12/2003 | Foss et al. ...................... 365/233 |
| 6,658,016 B1 | 12/2003 | Dai et al. |
| 6,658,530 B1 | 12/2003 | Robertson et al. ............ 711/115 |
| 6,659,512 B1 | 12/2003 | Harper et al. |
| 6,664,625 B2 | 12/2003 | Hiruma |
| 6,665,224 B1 | 12/2003 | Lehmann et al. ............. 365/222 |
| 6,665,227 B2 | 12/2003 | Fetzer ........................... 365/229 |
| 6,668,242 B1 | 12/2003 | Reynov et al. |
| 6,674,154 B2 | 1/2004 | Minamio et al. |
| 6,683,372 B1 | 1/2004 | Wong et al. ................... 257/686 |
| 6,684,292 B2 | 1/2004 | Piccirillo et al. |
| 6,690,191 B2 | 2/2004 | Wu et al. |
| 6,697,295 B2 | 2/2004 | Farmwald et al. ............ 365/233 |
| 6,701,446 B2 | 3/2004 | Tsern et al. .................... 713/501 |
| 6,705,877 B1 | 3/2004 | Li et al. .......................... 439/74 |
| 6,708,144 B1 | 3/2004 | Merryman et al. ........... 703/14 |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,714,891 B2 | 3/2004 | Dendinger .................... 702/132 |
| 6,724,684 B2 | 4/2004 | Kim ............................... 365/233 |
| 6,730,540 B2 | 5/2004 | Siniaguine |
| 6,731,009 B1 | 5/2004 | Jones et al. |
| 6,731,527 B2 | 5/2004 | Brown ........................... 365/63 |
| 6,742,098 B1 | 5/2004 | Halbert et al. |
| 6,744,687 B2 | 6/2004 | Koo et al. ...................... 365/226 |
| 6,747,887 B2* | 6/2004 | Halbert et al. ................ 365/51 |
| 6,751,113 B2 | 6/2004 | Bhakta et al. |
| 6,751,696 B2 | 6/2004 | Farmwald et al. ............ 710/305 |

| | | | | | |
|---|---|---|---|---|---|
| 6,754,129 B2 | 6/2004 | Khateri et al. ............... 365/226 | 7,066,741 B2 | 6/2006 | Burns et al. |
| 6,754,132 B2 | 6/2004 | Kyung ........................... 365/233 | 7,075,175 B2 | 7/2006 | Kazi et al. ..................... 257/678 |
| 6,757,751 B1 | 6/2004 | Gene ............................... 710/36 | 7,079,396 B2 | 7/2006 | Gates et al. |
| 6,762,948 B2 | 7/2004 | Kyun et al. ..................... 365/51 | 7,079,441 B1 | 7/2006 | Partsch et al. ................ 365/226 |
| 6,765,812 B2 | 7/2004 | Anderson | 7,079,446 B2 | 7/2006 | Murtagh et al. .............. 365/233 |
| 6,766,469 B2 | 7/2004 | Larson et al. | 7,085,152 B2 | 8/2006 | Ellis et al. ..................... 365/149 |
| 6,771,526 B2 | 8/2004 | LaBerge | 7,085,941 B2 | 8/2006 | Li ................................... 713/300 |
| 6,772,359 B2 | 8/2004 | Kwak et al. | 7,089,438 B2 | 8/2006 | Raad .............................. 713/322 |
| 6,779,097 B2 | 8/2004 | Gillingham et al. .......... 711/167 | 7,093,101 B2 | 8/2006 | Aasheim et al. .............. 711/207 |
| 6,785,767 B2 | 8/2004 | Coulson ........................ 711/112 | 7,103,730 B2 | 9/2006 | Saxena et al. ................. 711/156 |
| 6,791,877 B2 | 9/2004 | Miura et al. .................. 365/185 | 7,119,428 B2 | 10/2006 | Tanie et al. |
| 6,795,899 B2 | 9/2004 | Dodd et al. .................... 711/137 | 7,120,727 B2 | 10/2006 | Lee et al. .......................... 711/5 |
| 6,799,241 B2 | 9/2004 | Kahn et al. .................... 711/105 | 7,126,399 B1 | 10/2006 | Lee ................................ 327/261 |
| 6,801,989 B2 | 10/2004 | Johnson et al. ............... 711/167 | 7,127,567 B2 | 10/2006 | Ramakrishnan et al. |
| 6,807,598 B2 | 10/2004 | Farmwald et al. ............ 710/305 | 7,133,960 B1 | 11/2006 | Thompson et al. ............... 711/5 |
| 6,807,655 B1 | 10/2004 | Rehani et al. ..................... 716/4 | 7,136,978 B2 | 11/2006 | Miura et al. ................... 711/165 |
| 6,816,991 B2 | 11/2004 | Sanghani ....................... 714/733 | 7,149,145 B2 | 12/2006 | Kim et al. ...................... 365/233 |
| 6,819,602 B2 | 11/2004 | Seo et al. ....................... 365/193 | 7,149,824 B2 | 12/2006 | Johnson .......................... 710/35 |
| 6,819,617 B2 | 11/2004 | Hwang et al. ................. 365/222 | 7,173,863 B2 | 2/2007 | Conley et al. ................. 365/189 |
| 6,820,163 B1 | 11/2004 | McCall et al. ................. 710/310 | 7,200,021 B2 | 4/2007 | Raghuram ....................... 365/51 |
| 6,820,169 B2 | 11/2004 | Wilcox et al. ................. 711/105 | 7,205,789 B1 | 4/2007 | Karabatsos ....................... 326/30 |
| 6,826,104 B2 | 11/2004 | Kawaguchi et al. ........... 365/222 | 7,210,059 B2 | 4/2007 | Jeddeloh |
| 6,839,290 B2 | 1/2005 | Ahmad et al. ................. 365/193 | 7,215,561 B2 * | 5/2007 | Park et al. ........................ 365/52 |
| 6,845,027 B2 | 1/2005 | Mayer et al. | 7,218,566 B1 | 5/2007 | Totolos, Jr. et al. |
| 6,845,055 B1 | 1/2005 | Koga et al. .................... 365/229 | 7,224,595 B2 * | 5/2007 | Dreps et al. ..................... 365/63 |
| 6,847,582 B2 | 1/2005 | Pan ................................. 365/233 | 7,228,264 B2 | 6/2007 | Barrenscheen et al. ......... 703/23 |
| 6,850,449 B2 | 2/2005 | Takahashi ...................... 365/222 | 7,231,562 B2 | 6/2007 | Ohlhoff et al. |
| 6,862,202 B2 | 3/2005 | Schaefer | 7,233,541 B2 * | 6/2007 | Yamamoto et al. ...... 365/230.03 |
| 6,862,249 B2 | 3/2005 | Kyung ........................... 365/233 | 7,234,081 B2 | 6/2007 | Nguyen et al. |
| 6,862,653 B1 | 3/2005 | Dodd et al. .................... 711/105 | 7,243,185 B2 | 7/2007 | See et al. |
| 6,873,534 B2 | 3/2005 | Bhakta et al. | 7,243,252 B2 * | 7/2007 | Yanagawa ...................... 713/400 |
| 6,878,570 B2 | 4/2005 | Lyu et al. | 7,245,541 B2 | 7/2007 | Janzen ........................... 365/198 |
| 6,894,933 B2 | 5/2005 | Kuzmenka et al. ....... 365/189.05 | 7,254,036 B2 | 8/2007 | Pauley et al. .................. 361/721 |
| 6,898,683 B2 | 5/2005 | Nakamura ..................... 711/167 | 7,266,639 B2 | 9/2007 | Raghuram ...................... 711/115 |
| 6,908,314 B2 | 6/2005 | Brown ............................. 439/68 | 7,269,042 B2 | 9/2007 | Kinsley et al. .................. 365/52 |
| 6,912,778 B2 | 7/2005 | Ahn et al. ........................ 29/852 | 7,269,708 B2 | 9/2007 | Ware .............................. 711/203 |
| 6,914,786 B1 | 7/2005 | Paulsen et al. | 7,274,583 B2 | 9/2007 | Park et al. |
| 6,917,219 B2 | 7/2005 | New ................................ 326/41 | 7,277,333 B2 | 10/2007 | Schaefer |
| 6,922,371 B2 | 7/2005 | Takahashi et al. ............ 365/227 | 7,286,436 B2 | 10/2007 | Bhakta et al. .................. 365/230 |
| 6,930,900 B2 | 8/2005 | Bhakta et al. | 7,289,386 B2 | 10/2007 | Bhakta et al. .................. 365/230 |
| 6,930,903 B2 | 8/2005 | Bhakta et al. | 7,296,754 B2 | 11/2007 | Nishizawa et al. ............ 235/492 |
| 6,938,119 B2 | 8/2005 | Kohn et al. .................... 711/105 | 7,299,330 B2 | 11/2007 | Gillingham et al. ........... 711/167 |
| 6,943,450 B2 | 9/2005 | Fee et al. | 7,302,598 B2 | 11/2007 | Suzuki et al. |
| 6,944,748 B2 | 9/2005 | Sanches et al. | 7,307,863 B2 | 12/2007 | Yen et al. ........................ 365/63 |
| 6,947,341 B2 | 9/2005 | Stubbs et al. | 7,317,250 B2 | 1/2008 | Koh et al. |
| 6,951,982 B2 | 10/2005 | Chye et al. | 7,337,293 B2 | 2/2008 | Brittain et al. |
| 6,952,794 B2 | 10/2005 | Lu | 7,363,422 B2 | 4/2008 | Perego et al. .................. 711/105 |
| 6,961,281 B2 | 11/2005 | Wong et al. .............. 365/230.03 | 7,366,947 B2 | 4/2008 | Gower et al. |
| 6,968,416 B2 | 11/2005 | Moy ............................... 710/310 | 7,379,316 B2 | 5/2008 | Rajan ............................... 365/63 |
| 6,968,419 B1 | 11/2005 | Holman ............................. 711/5 | 7,386,656 B2 | 6/2008 | Rajan et al. .................... 711/103 |
| 6,970,968 B1 | 11/2005 | Holman ............................. 711/5 | 7,392,338 B2 | 6/2008 | Rajan et al. .................... 711/103 |
| 6,980,021 B1 | 12/2005 | Srivastava et al. .............. 326/30 | 7,408,393 B1 | 8/2008 | Jain et al. ....................... 327/202 |
| 6,986,118 B2 | 1/2006 | Dickman ........................... 716/8 | 7,409,492 B2 | 8/2008 | Tanaka et al. .................. 711/103 |
| 6,992,501 B2 | 1/2006 | Rapport | 7,414,917 B2 * | 8/2008 | Ruckerbauer et al. ... 365/233.13 |
| 6,992,950 B2 | 1/2006 | Foss et al. ...................... 365/233 | 7,428,644 B2 | 9/2008 | Jeddeloh et al. |
| 7,000,062 B2 | 2/2006 | Perego et al. ...................... 711/5 | 7,437,579 B2 | 10/2008 | Jeddeloh et al. .............. 713/300 |
| 7,003,618 B2 | 2/2006 | Perego et al. ...................... 711/5 | 7,441,064 B2 * | 10/2008 | Gaskins .......................... 710/307 |
| 7,003,639 B2 | 2/2006 | Tsern et al. .................... 711/154 | 7,457,122 B2 | 11/2008 | Lai et al. |
| 7,007,095 B2 | 2/2006 | Chen et al. | 7,464,225 B2 | 12/2008 | Tsern ............................. 711/115 |
| 7,007,175 B2 | 2/2006 | Chang et al. ................... 713/300 | 7,472,220 B2 | 12/2008 | Rajan et al. .................... 711/103 |
| 7,010,642 B2 | 3/2006 | Perego et al. ...................... 711/5 | 7,474,576 B2 | 1/2009 | Co et al. |
| 7,010,736 B1 | 3/2006 | Teh et al. ....................... 714/733 | 7,480,147 B2 | 1/2009 | Hoss et al. |
| 7,024,518 B2 | 4/2006 | Halbert et al. ................. 711/115 | 7,480,774 B2 | 1/2009 | Ellis et al. |
| 7,026,708 B2 | 4/2006 | Cady et al. | 7,496,777 B2 | 2/2009 | Kapil ............................. 713/324 |
| 7,028,215 B2 | 4/2006 | Depew et al. | 7,515,453 B2 | 4/2009 | Rajan ............................... 365/63 |
| 7,028,234 B2 | 4/2006 | Huckaby et al. ............... 714/710 | 7,532,537 B2 | 5/2009 | Solomon et al. .............. 365/230 |
| 7,033,861 B1 | 4/2006 | Partridge et al. | 7,539,800 B2 | 5/2009 | Dell et al. |
| 7,035,150 B2 | 4/2006 | Streif et al. .................... 365/194 | 7,573,136 B2 | 8/2009 | Jiang et al. |
| 7,043,599 B1 | 5/2006 | Ware et al. ..................... 711/106 | 7,580,312 B2 | 8/2009 | Rajan et al. |
| 7,043,611 B2 | 5/2006 | McClannahan et al. | 7,581,121 B2 | 8/2009 | Barth et al. |
| 7,045,396 B2 | 5/2006 | Crowley et al. | 7,581,127 B2 | 8/2009 | Rajan et al. |
| 7,045,901 B2 | 5/2006 | Lin et al. | 7,590,796 B2 | 9/2009 | Rajan et al. |
| 7,046,538 B2 | 5/2006 | Kinsley et al. | 7,599,205 B2 | 10/2009 | Rajan |
| 7,053,470 B1 | 5/2006 | Sellers et al. | 7,606,245 B2 | 10/2009 | Ma et al. |
| 7,053,478 B2 | 5/2006 | Roper et al. | 7,609,567 B2 | 10/2009 | Rajan et al. |
| 7,058,776 B2 | 6/2006 | Lee ................................ 711/167 | 7,613,880 B2 | 11/2009 | Miura et al. |
| 7,058,863 B2 | 6/2006 | Kouchi et al. ................. 714/718 | 7,619,912 B2 | 11/2009 | Bhakta et al. |
| 7,061,784 B2 | 6/2006 | Jakobs et al. | 7,724,589 B2 | 5/2010 | Rajan et al. |
| 7,061,823 B2 | 6/2006 | Faue et al. ................ 365/230.08 | 7,730,338 B2 | 6/2010 | Rajan et al. |

| | | |
|---|---|---|
| 7,761,724 B2 | 7/2010 | Rajan et al. |
| 7,934,070 B2 | 4/2011 | Brittain et al. |
| 7,990,797 B2 | 8/2011 | Moshayedi et al. |
| 2001/0000822 A1 | 5/2001 | Dell et al. .................. 711/170 |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0019961 A1 | 2/2002 | Blodgett .................. 714/718 |
| 2002/0034068 A1 | 3/2002 | Weber et al. ................ 361/790 |
| 2002/0038405 A1 | 3/2002 | Leddige et al. ............. 711/115 |
| 2002/0041507 A1 | 4/2002 | Woo et al. .................... 365/51 |
| 2002/0051398 A1 | 5/2002 | Mizugaki ..................... 365/222 |
| 2002/0060945 A1 | 5/2002 | Ikeda |
| 2002/0064073 A1 | 5/2002 | Chien ......................... 365/200 |
| 2002/0064083 A1 | 5/2002 | Ryu et al. .................... 365/233 |
| 2002/0089831 A1 | 7/2002 | Forthun ....................... 361/760 |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar ........................... 713/320 |
| 2002/0129204 A1 | 9/2002 | Leighnor et al. |
| 2002/0145900 A1 | 10/2002 | Schaefer ....................... 365/52 |
| 2002/0165706 A1 | 11/2002 | Raynham ...................... 703/25 |
| 2002/0167092 A1 | 11/2002 | Fee et al. |
| 2002/0172024 A1 | 11/2002 | Hui et al. |
| 2002/0174274 A1 | 11/2002 | Wu et al. ..................... 710/100 |
| 2002/0184438 A1 | 12/2002 | Usui ............................. 711/106 |
| 2003/0002262 A1 | 1/2003 | Benisek et al. .............. 361/728 |
| 2003/0011993 A1 | 1/2003 | Summers et al. |
| 2003/0016550 A1 | 1/2003 | Yoo et al. |
| 2003/0021175 A1 | 1/2003 | Tae Kwak ..................... 365/219 |
| 2003/0026155 A1 | 2/2003 | Yamagata |
| 2003/0026159 A1 | 2/2003 | Frankowsky et al. |
| 2003/0035312 A1 | 2/2003 | Halbert et al. ................... 365/51 |
| 2003/0039158 A1 | 2/2003 | Horiguchi et al. |
| 2003/0041295 A1 | 2/2003 | Hou et al. |
| 2003/0061458 A1 | 3/2003 | Wilcox et al. ................ 711/167 |
| 2003/0061459 A1 | 3/2003 | Aboulenein et al. |
| 2003/0093614 A1 | 5/2003 | Kohn et al. ................... 711/105 |
| 2003/0101392 A1 | 5/2003 | Lee ................................. 714/718 |
| 2003/0105932 A1 | 6/2003 | David et al. .................. 711/167 |
| 2003/0117875 A1 | 6/2003 | Lee et al. ..................... 365/226 |
| 2003/0123389 A1 | 7/2003 | Russell et al. |
| 2003/0126338 A1 | 7/2003 | Dodd et al. ................... 710/305 |
| 2003/0127737 A1 | 7/2003 | Takahashi |
| 2003/0131160 A1 | 7/2003 | Hampel et al. ................ 710/22 |
| 2003/0145163 A1 | 7/2003 | Seo et al. ..................... 711/106 |
| 2003/0158995 A1 | 8/2003 | Lee et al. ..................... 711/105 |
| 2003/0164539 A1 | 9/2003 | Yau |
| 2003/0164543 A1 | 9/2003 | Kheng Lee |
| 2003/0182513 A1 | 9/2003 | Dodd et al. ................... 711/137 |
| 2003/0183934 A1 | 10/2003 | Barrett |
| 2003/0189868 A1 | 10/2003 | Riesenman et al. .......... 365/226 |
| 2003/0189870 A1 | 10/2003 | Wilcox ........................... 365/303 |
| 2003/0191888 A1 | 10/2003 | Klein ............................. 711/105 |
| 2003/0191915 A1 | 10/2003 | Saxena et al. ................ 711/160 |
| 2003/0200382 A1 | 10/2003 | Wells et al. ................... 711/106 |
| 2003/0200474 A1 | 10/2003 | Li ................................. 713/320 |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1* | 12/2003 | Park et al. ..................... 365/200 |
| 2003/0227798 A1 | 12/2003 | Pax ............................ 365/189.12 |
| 2003/0229821 A1 | 12/2003 | Ma .................................. 714/8 |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. .......................... 365/226 |
| 2003/0234664 A1 | 12/2003 | Yamagata |
| 2004/0016994 A1 | 1/2004 | Huang |
| 2004/0027902 A1 | 2/2004 | Ooishi et al. |
| 2004/0034732 A1 | 2/2004 | Valin et al. ........................ 711/4 |
| 2004/0034755 A1 | 2/2004 | LaBerge et al. |
| 2004/0037133 A1* | 2/2004 | Park et al. ..................... 365/202 |
| 2004/0044808 A1 | 3/2004 | Salmon et al. ................... 710/8 |
| 2004/0047228 A1 | 3/2004 | Chen ............................. 365/232 |
| 2004/0057317 A1 | 3/2004 | Schaefer |
| 2004/0064647 A1 | 4/2004 | DeWhitt et al. ............. 711/135 |
| 2004/0064767 A1 | 4/2004 | Huckaby et al. ............. 714/710 |
| 2004/0083324 A1 | 4/2004 | Rabinovitz et al. |
| 2004/0088475 A1 | 5/2004 | Streif et al. .................. 711/105 |
| 2004/0100837 A1 | 5/2004 | Lee |
| 2004/0117723 A1 | 6/2004 | Foss ............................... 714/805 |
| 2004/0123173 A1 | 6/2004 | Emberling et al. ........... 714/733 |
| 2004/0125635 A1 | 7/2004 | Kuzmenka |
| 2004/0133736 A1 | 7/2004 | Kyung ........................... 711/105 |
| 2004/0139359 A1 | 7/2004 | Samson et al. ............... 713/320 |
| 2004/0145963 A1 | 7/2004 | Byon ............................. 365/233 |
| 2004/0151038 A1 | 8/2004 | Ruckerbauer et al. |
| 2004/0174765 A1 | 9/2004 | Seo et al. ...................... 365/233 |
| 2004/0177079 A1 | 9/2004 | Gluhovsky et al. ........... 707/100 |
| 2004/0178824 A1 | 9/2004 | Pan |
| 2004/0184324 A1 | 9/2004 | Pax ............................ 365/189.12 |
| 2004/0186956 A1 | 9/2004 | Perego et al. ................. 711/115 |
| 2004/0188704 A1 | 9/2004 | Halbert et al. ................ 257/145 |
| 2004/0196732 A1 | 10/2004 | Lee ................................ 365/233 |
| 2004/0205433 A1 | 10/2004 | Gower et al. |
| 2004/0208173 A1 | 10/2004 | Di Gregorio .................. 370/360 |
| 2004/0225858 A1 | 11/2004 | Brueggen |
| 2004/0228166 A1 | 11/2004 | Braun et al. ................... 365/154 |
| 2004/0228196 A1 | 11/2004 | Kwak et al. |
| 2004/0228203 A1 | 11/2004 | Koo ............................... 365/233 |
| 2004/0230932 A1 | 11/2004 | Dickmann ...................... 716/10 |
| 2004/0236877 A1 | 11/2004 | Burton |
| 2004/0250989 A1 | 12/2004 | Im et al. |
| 2004/0256638 A1 | 12/2004 | Perego et al. ................. 257/200 |
| 2004/0257847 A1 | 12/2004 | Matsui et al. ................... 365/63 |
| 2004/0260957 A1 | 12/2004 | Jeddeloh et al. .............. 713/300 |
| 2004/0264255 A1 | 12/2004 | Royer ....................... 365/189.01 |
| 2004/0268161 A1 | 12/2004 | Ross .............................. 713/300 |
| 2005/0018495 A1 | 1/2005 | Bhakta et al. .................. 365/19 |
| 2005/0021874 A1 | 1/2005 | Georgiou et al. ............. 709/250 |
| 2005/0024963 A1 | 2/2005 | Jakobs et al. |
| 2005/0027928 A1 | 2/2005 | Avraham et al. ............. 711/103 |
| 2005/0028038 A1 | 2/2005 | Pomaranski et al. ........... 714/42 |
| 2005/0034004 A1 | 2/2005 | Bunker et al. |
| 2005/0036350 A1 | 2/2005 | So et al. .......................... 365/63 |
| 2005/0041504 A1 | 2/2005 | Perego et al. ................. 365/222 |
| 2005/0044303 A1 | 2/2005 | Perego et al. ..................... 711/5 |
| 2005/0044305 A1 | 2/2005 | Jakobs et al. ................. 711/105 |
| 2005/0047192 A1 | 3/2005 | Matsui et al. ................. 365/145 |
| 2005/0071543 A1 | 3/2005 | Ellis et al. .................... 711/106 |
| 2005/0078532 A1 | 4/2005 | Ruckerbauer et al. ........ 365/199 |
| 2005/0081085 A1 | 4/2005 | Ellis et al. ......................... 714/5 |
| 2005/0099834 A1 | 5/2005 | Funaba et al. .................. 365/63 |
| 2005/0102590 A1 | 5/2005 | Norris et al. .................. 714/719 |
| 2005/0105318 A1 | 5/2005 | Funaba et al. .................. 365/63 |
| 2005/0108460 A1 | 5/2005 | David |
| 2005/0127531 A1 | 6/2005 | Tay et al. |
| 2005/0132158 A1 | 6/2005 | Hampel et al. ............... 711/167 |
| 2005/0135176 A1 | 6/2005 | Ramakrishnan et al. |
| 2005/0138267 A1 | 6/2005 | Bains et al. ................... 711/100 |
| 2005/0138304 A1 | 6/2005 | Ramakrishnan et al. |
| 2005/0139977 A1 | 6/2005 | Nishio et al. ................. 257/686 |
| 2005/0141199 A1 | 6/2005 | Chiou et al. .................. 361/704 |
| 2005/0149662 A1 | 7/2005 | Perego et al. ..................... 711/5 |
| 2005/0152212 A1 | 7/2005 | Yang et al. .................... 365/233 |
| 2005/0156934 A1 | 7/2005 | Perego et al. ................. 345/531 |
| 2005/0157579 A1* | 7/2005 | Perego et al. ............. 365/230.03 |
| 2005/0166026 A1 | 7/2005 | Ware et al. ................... 711/167 |
| 2005/0193163 A1 | 9/2005 | Perego et al. ................. 711/105 |
| 2005/0193183 A1 | 9/2005 | Barth et al. |
| 2005/0194676 A1 | 9/2005 | Fukuda et al. |
| 2005/0194991 A1 | 9/2005 | Dour et al. ..................... 326/30 |
| 2005/0195629 A1 | 9/2005 | Leddige et al. ................. 365/51 |
| 2005/0201063 A1 | 9/2005 | Lee et al. |
| 2005/0204111 A1 | 9/2005 | Natarajan ..................... 711/167 |
| 2005/0207255 A1 | 9/2005 | Perego et al. ................. 365/222 |
| 2005/0210196 A1 | 9/2005 | Perego et al. ................. 711/115 |
| 2005/0223179 A1 | 10/2005 | Perego et al. ................. 711/154 |

| | | | | | | |
|---|---|---|---|---|---|---|
| 2005/0224948 A1 | 10/2005 | Lee et al. ............... 257/686 | | 2007/0162700 A1 | 7/2007 | Fortin et al. ............... 711/118 |
| 2005/0232049 A1 | 10/2005 | Park | | 2007/0188997 A1 | 8/2007 | Hockanson et al. |
| 2005/0235119 A1 | 10/2005 | Sechrest et al. ............... 711/158 | | 2007/0192563 A1 | 8/2007 | Rajan et al. ............... 711/202 |
| 2005/0235131 A1 | 10/2005 | Ware ............... 711/203 | | 2007/0195613 A1 | 8/2007 | Rajan et al. ............... 365/189.05 |
| 2005/0237838 A1 | 10/2005 | Kwak et al. ............... 365/222 | | 2007/0204075 A1 | 8/2007 | Rajan et al. |
| 2005/0243635 A1 | 11/2005 | Schaefer ............... 365/227 | | 2007/0216445 A1 | 9/2007 | Raghavan et al. ............... 326/83 |
| 2005/0246558 A1 | 11/2005 | Ku | | 2007/0247194 A1 | 10/2007 | Jain ............... 326/87 |
| 2005/0249011 A1 | 11/2005 | Maeda | | 2007/0279084 A1 | 12/2007 | Oh et al. |
| 2005/0259504 A1 | 11/2005 | Murtugh et al. ............... 365/233 | | 2007/0288683 A1 | 12/2007 | Panabaker et al. ............... 711/101 |
| 2005/0263312 A1 | 12/2005 | Bolken et al. | | 2007/0288686 A1 | 12/2007 | Arcedera et al. ............... 711/103 |
| 2005/0265506 A1 | 12/2005 | Foss et al. ............... 375/376 | | 2007/0288687 A1 | 12/2007 | Panabaker et al. ............... 711/103 |
| 2005/0269715 A1 | 12/2005 | Yoo | | 2008/0002447 A1 | 1/2008 | Gulachenski et al. |
| 2005/0278474 A1 | 12/2005 | Perersen et al. ............... 711/5 | | 2008/0010435 A1 | 1/2008 | Smith et al. |
| 2005/0281096 A1 | 12/2005 | Bhakta et al. | | 2008/0025108 A1 | 1/2008 | Rajan et al. ............... 365/189.05 |
| 2005/0281123 A1 | 12/2005 | Bell et al. ............... 365/230.08 | | 2008/0025122 A1 | 1/2008 | Schakel et al. ............... 365/222 |
| 2005/0283572 A1 | 12/2005 | Ishihara | | 2008/0025136 A1 | 1/2008 | Rajan et al. ............... 365/230.08 |
| 2005/0285174 A1 | 12/2005 | Saito et al. ............... 257/296 | | 2008/0025137 A1 | 1/2008 | Rajan et al. ............... 365/239 |
| 2005/0289292 A1 | 12/2005 | Morrow et al. ............... 711/105 | | 2008/0027697 A1 | 1/2008 | Rajan et al. ............... 703/14 |
| 2005/0289317 A1 | 12/2005 | Liou et al. ............... 711/170 | | 2008/0027702 A1 | 1/2008 | Rajan et al. ............... 703/21 |
| 2006/0002201 A1 | 1/2006 | Janzen ............... 365/191 | | 2008/0027703 A1 | 1/2008 | Rajan et al. ............... 703/21 |
| 2006/0010339 A1 | 1/2006 | Klein ............... 714/5 | | 2008/0028135 A1 | 1/2008 | Rajan et al. |
| 2006/0026484 A1 | 2/2006 | Hollums ............... 714/746 | | 2008/0028136 A1 | 1/2008 | Schakel et al. ............... 711/106 |
| 2006/0038597 A1 | 2/2006 | Becker et al. | | 2008/0028137 A1 | 1/2008 | Schakel et al. |
| 2006/0039204 A1 | 2/2006 | Cornelius | | 2008/0031030 A1 | 2/2008 | Rajan et al. ............... 365/63 |
| 2006/0039205 A1 | 2/2006 | Cornelius ............... 365/189.05 | | 2008/0031072 A1 | 2/2008 | Rajan et al. ............... 365/227 |
| 2006/0041711 A1 | 2/2006 | Miura et al. ............... 711/103 | | 2008/0037353 A1 | 2/2008 | Rajan et al. ............... 365/227 |
| 2006/0041730 A1 | 2/2006 | Larson ............... 711/167 | | 2008/0056014 A1 | 3/2008 | Rajan et al. ............... 365/189.03 |
| 2006/0044909 A1 | 3/2006 | Kinsley et al. ............... 365/222 | | 2008/0062773 A1 | 3/2008 | Rajan et al. ............... 365/189.03 |
| 2006/0044913 A1 | 3/2006 | Klein et al. | | 2008/0065820 A1 | 3/2008 | Gillingham et al. ............... 711/105 |
| 2006/0049502 A1 | 3/2006 | Goodwin et al. | | 2008/0082763 A1 | 4/2008 | Rajan et al. ............... 711/154 |
| 2006/0050574 A1 | 3/2006 | Streif et al. ............... 365/194 | | 2008/0086588 A1 | 4/2008 | Danilak et al. |
| 2006/0056244 A1 | 3/2006 | Ware ............... 365/194 | | 2008/0089034 A1 | 4/2008 | Hoss et al. |
| 2006/0062047 A1 | 3/2006 | Bhakta et al. | | 2008/0098277 A1 | 4/2008 | Hazelzet |
| 2006/0067141 A1 | 3/2006 | Perego et al. | | 2008/0103753 A1 | 5/2008 | Rajan et al. |
| 2006/0085616 A1 | 4/2006 | Zeighami et al. ............... 711/167 | | 2008/0104314 A1 | 5/2008 | Rajan et al. |
| 2006/0087900 A1 | 4/2006 | Bucksch et al. | | 2008/0109206 A1 | 5/2008 | Rajan et al. |
| 2006/0090031 A1 | 4/2006 | Kirshenbaum et al. ............... 711/113 | | 2008/0109595 A1 | 5/2008 | Rajan et al. |
| 2006/0090054 A1 | 4/2006 | Choi et al. ............... 711/167 | | 2008/0109597 A1 | 5/2008 | Schakel et al. |
| 2006/0106951 A1 | 5/2006 | Bains ............... 710/5 | | 2008/0109598 A1 | 5/2008 | Schakel et al. |
| 2006/0112214 A1 | 5/2006 | Yeh ............... 711/103 | | 2008/0115006 A1 | 5/2008 | Smith et al. ............... 713/601 |
| 2006/0112219 A1 | 5/2006 | Chawla et al. | | 2008/0120443 A1 | 5/2008 | Rajan et al. |
| 2006/0117152 A1 | 6/2006 | Amidi et al. ............... 711/154 | | 2008/0120458 A1 | 5/2008 | Gillingham et al. ............... 711/105 |
| 2006/0117160 A1 | 6/2006 | Jackson et al. ............... 711/170 | | 2008/0123459 A1 | 5/2008 | Rajan et al. ............... 365/227 |
| 2006/0118933 A1 | 6/2006 | Haba | | 2008/0126687 A1 | 5/2008 | Rajan et al. |
| 2006/0120193 A1 | 6/2006 | Casper | | 2008/0126688 A1 | 5/2008 | Rajan et al. |
| 2006/0123265 A1 | 6/2006 | Ruckerbauer et al. | | 2008/0126689 A1 | 5/2008 | Rajan et al. |
| 2006/0126369 A1 | 6/2006 | Raghuram | | 2008/0126690 A1 | 5/2008 | Rajan et al. ............... 711/105 |
| 2006/0129712 A1 | 6/2006 | Raghuram ............... 710/52 | | 2008/0126692 A1 | 5/2008 | Rajan et al. |
| 2006/0129740 A1 | 6/2006 | Ruckerbauer et al. | | 2008/0133825 A1 | 6/2008 | Rajan et al. |
| 2006/0129755 A1 | 6/2006 | Raghuram ............... 711/105 | | 2008/0155136 A1 | 6/2008 | Hishino |
| 2006/0133173 A1 | 6/2006 | Jain et al. | | 2008/0159027 A1 | 7/2008 | Kim |
| 2006/0136791 A1 | 6/2006 | Nierle | | 2008/0170425 A1 | 7/2008 | Rajan |
| 2006/0149982 A1 | 7/2006 | Vogt ............... 713/320 | | 2008/0195894 A1 | 8/2008 | Schreck et al. |
| 2006/0174082 A1 | 8/2006 | Bellows et al. | | 2008/0239857 A1 | 10/2008 | Rajan et al. ............... 365/227 |
| 2006/0176744 A1 | 8/2006 | Stave ............... 365/194 | | 2008/0239858 A1 | 10/2008 | Rajan et al. ............... 365/227 |
| 2006/0179262 A1 | 8/2006 | Brittain et al. | | 2009/0024789 A1 | 1/2009 | Rajan et al. |
| 2006/0179333 A1 | 8/2006 | Brittain et al. ............... 713/320 | | 2009/0024790 A1 | 1/2009 | Rajan et al. |
| 2006/0179334 A1 | 8/2006 | Brittain et al. ............... 713/320 | | 2009/0109613 A1 | 4/2009 | Legen et al. |
| 2006/0180926 A1 | 8/2006 | Mullen et al. | | 2009/0216939 A1 | 8/2009 | Smith et al. |
| 2006/0181953 A1 | 8/2006 | Rotenberg et al. ............... 365/230.06 | | 2009/0285031 A1 | 11/2009 | Rajan et al. |
| 2006/0195631 A1 | 8/2006 | Rajamani | | 2009/0290442 A1 | 11/2009 | Rajan |
| 2006/0198178 A1 | 9/2006 | Kinsley et al. | | 2010/0005218 A1 | 1/2010 | Gower et al. |
| 2006/0203590 A1 | 9/2006 | Mori et al. | | 2010/0020585 A1 | 1/2010 | Rajan |
| 2006/0206738 A1 | 9/2006 | Jeddeloh et al. ............... 713/320 | | 2010/0257304 A1 | 10/2010 | Rajan et al. |
| 2006/0233012 A1 | 10/2006 | Sekiguchi et al. | | 2010/0271888 A1 | 10/2010 | Rajan |
| 2006/0236165 A1 | 10/2006 | Cepulis et al. | | 2010/0281280 A1 | 11/2010 | Rajan et al. |
| 2006/0236201 A1 | 10/2006 | Gower et al. | | | | |
| 2006/0248261 A1 | 11/2006 | Jacob et al. | | | FOREIGN PATENT DOCUMENTS | |
| 2006/0248387 A1 | 11/2006 | Nicholson et al. ............... 714/22 | | DE | 102004053316 | 5/2006 |
| 2006/0262586 A1 | 11/2006 | Solomon et al. | | DE | 102005036528 | 2/2007 |
| 2006/0294295 A1 | 12/2006 | Fukuzo ............... 711/105 | | EP | 0644547 | 3/1995 |
| 2007/0005998 A1 | 1/2007 | Jain et al. | | JP | 62121978 | 6/1987 |
| 2007/0050530 A1 | 3/2007 | Rajan ............... 711/5 | | JP | 01171047 | 7/1989 |
| 2007/0058471 A1 | 3/2007 | Rajan et al. ............... 365/222 | | JP | 03-099357 | 2/1991 |
| 2007/0070669 A1 | 3/2007 | Tsern | | JP | 03029357 | 2/1991 |
| 2007/0088995 A1 | 4/2007 | Tsern et al. ............... 714/724 | | JP | 03/276487 | 12/1991 |
| 2007/0091696 A1 | 4/2007 | Niggemeier et al. | | JP | 03286234 | 12/1991 |
| 2007/0106860 A1 | 5/2007 | Foster, Sr. et al. ............... 711/170 | | JP | 07-141870 | 6/1995 |
| 2007/0136537 A1 | 6/2007 | Doblar et al. | | JP | 08/077097 | 3/1996 |

| | | |
|---|---|---|
| JP | 08077097 | 3/1996 |
| JP | 11-149775 | 6/1999 |
| JP | 2002025255 | 1/2002 |
| JP | 3304893 B2 | 5/2002 |
| JP | 2006236388 | 9/2006 |
| KR | 1020040062717 | 7/2004 |
| WO | WO 95/05676 | 2/1995 |
| WO | WO9900734 | 1/1999 |
| WO | WO01/90900 | 11/2001 |
| WO | WO01/97160 | 12/2001 |
| WO | WO2007002324 | 1/2007 |
| WO | WO2007/028109 | 3/2007 |
| WO | WO 2007/038225 | 4/2007 |
| WO | WO2007/095080 | 8/2007 |
| WO | WO2008063251 | 5/2008 |

OTHER PUBLICATIONS

Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Kellerbauer "Die Schnelle Million," with translation, "The quick million."
Wu et al., "eNVy: A Non-Volatile, Main Memory Storage System," to appear in ASPLOS VI,.
"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., "Buffer Device For Memory Modules (DIMM)" Qimonda 2006, p. 1.
Written Opinion from PCT Application No. PCT/US06/24360 mailed on Jan. 8, 2007.
Preliminary Report On Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Wu et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Non-Final Office Action from U.S. Appl. No. 11/461,420 Dated Jul. 23, 2009.
Notice of Allowance from U.S. Appl. No. 11/461,430 Dated Sep. 10, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.

Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Non-Final Office Action from U.S. Appl. No. 11/941,589 Dated Oct. 1, 2009.
Supplemental European Search Report and Search Opinion issued Sep. 21, 2009 in European Application No. 07870726.2, 8 pages.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <Url: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Dec. 3, 2010.
Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Non-Final Office Action from U.S. Appl. No. 11/702,981 Dated Mar. 11, 2009.
Notice of Allowance from U.S. Appl. No. 11/762,010 Dated Jul. 2, 2010.
Notice of Allowance from U.S. Appl. No. 11/762,010 Dated Oct. 22, 2010.
Notice of Allowance from Application No. 11/762,013 Dated Aug. 17, 2010.
Notice of Allowance from U.S. Appl. No. 11/762,013 Dated Dec. 7, 2010.
Notice of Allowance from Application No. 11/763,365 Dated Jun. 29, 2010.
Notice of Allowance from Application No. 11/763,365 Dated Oct. 20, 2010.
Non-Final Office Action from Application No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from Application No. 11/929,286 Dated Aug. 20, 2010.
Notice of Allowance from Application No. 11/929,320 Dated Sep. 29, 2010.
Final Office Action from Application No. 11/929,403 Dated Aug. 31, 2010.
Final Office Action from Application No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,500 Dated Jun. 24, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.

Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 22, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Non-Final Office Action from U.S. Appl. No. 11/929,417 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.

* cited by examiner

MULTI-RANK PARTIAL WIDTH MEMORY MODULES

RELATED APPLICATION(S)

The present application claims priority to provisional application Ser. No. 60/865,623 filed Nov. 13, 2006, which is incorporated herein by reference in its entirety for all purposes.

FIELD OF THE INVENTION

The present invention relates to memory modules and more particularly to multi-rank memory modules.

BACKGROUND

The memory controller of typical computer systems communicates with memory [e.g. dynamic random access memory (DRAM)] circuits that are positioned on dual inline memory modules (DIMMs). A set of signal lines, collectively referred to as a memory bus or memory channel, is used to connect the memory controller to one or more DIMMs. The memory bus typically includes a data bus, an address bus, a control bus, and clock signals. In a parallel memory bus topology, the memory bus connects to a plurality of DIMMs in parallel.

Each DIMM in a parallel memory bus topology connects to all the data signals, all the address signals, and some or all of the control and clock signals of the memory bus. Thus, the data bus width of a DIMM matches that of the memory bus. However, the number of data I/O signals of a DRAM circuit is usually smaller than the number of data I/O signals of a DIMM. In other words, the data bus width of a DRAM circuit is smaller than the data bus width of a DIMM. Therefore, a plurality of DRAM circuits are operated in parallel to match the data widths of the individual DRAM circuits to that of the DIMM. The plurality of DRAM circuits that are controlled by a common control signal (e.g. a chip select signal) and respond in parallel to an access from the memory controller are referred to as a rank of DRAM circuits. DIMMs with one and two ranks are commonly available.

In a parallel memory bus topology, the impedance discontinuity and the bus loading caused by a DIMM affects the signal integrity of the memory bus. Consequently, as the frequency of operation of the memory bus increases, the maximum number of DIMMs that can be supported by a memory bus decreases. For example, at a 533 MHz data rate, four DIMMs per channel are feasible. However, it is expected that only two DIMMs per channel may be feasible at a 1333 MHz data rate. Thus, computer system designers are increasingly being forced to choose between memory bandwidth and memory capacity.

There is thus a need for addressing these and/or other issues associated with the prior art.

SUMMARY

A system is provided for multi-rank, partial width memory modules. A memory controller is provided. Additionally, a memory bus is provided. Further, a memory module with a plurality of ranks of memory circuits is provided, the memory module including a first number of data pins that is less than a second number of data pins of the memory bus.

DETAILED DESCRIPTION

Figure 1A:
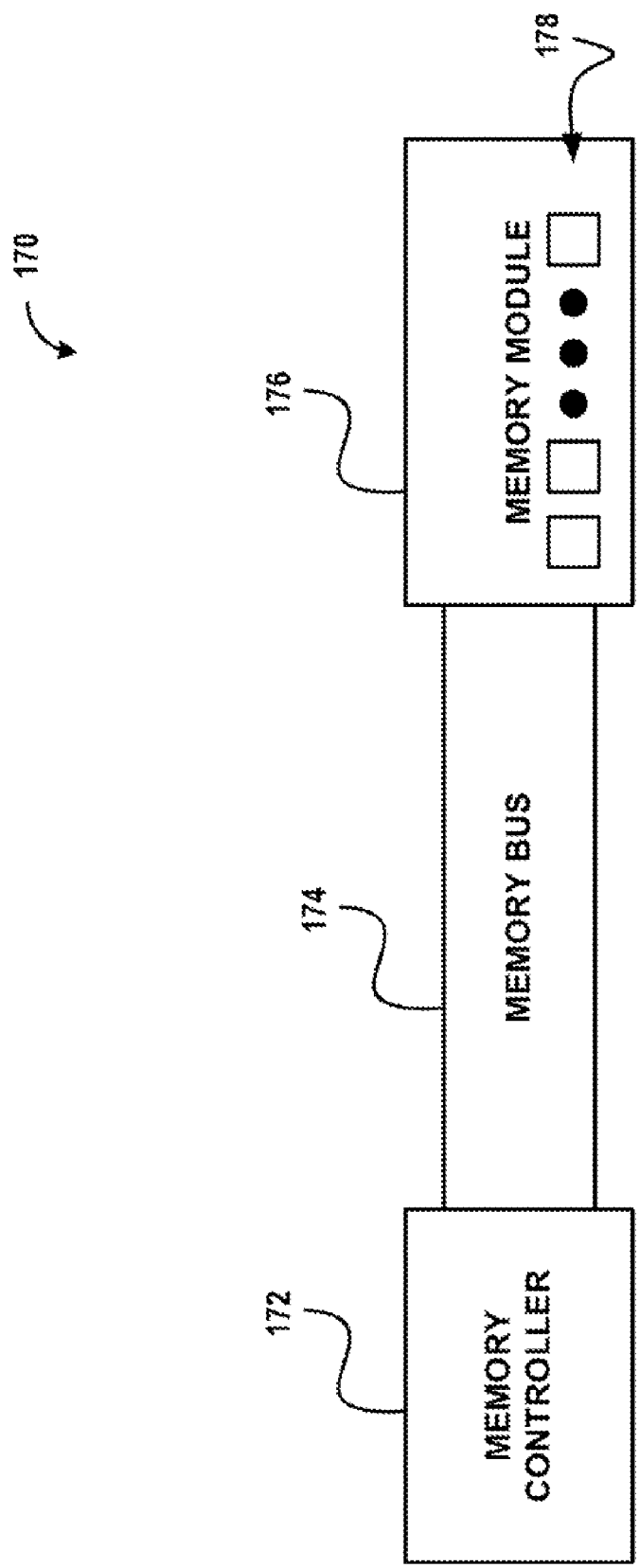
FIG. 1A shows a system for multi-rank, partial width memory modules, in accordance with one embodiment.

FIG. 1A shows a system 170 for multi-rank, partial width memory modules, in accordance with one embodiment. As shown, a memory controller 172 is provided. Additionally, a memory bus 174 is provided. Further, a memory module 176 with a plurality of ranks of memory circuits 178 is provided, the memory module 176 including a first number of data pins that is less than a second number of data pins of the memory bus.

In the context of the present description, a rank refers to at least one circuit that is controlled by a common control signal. The number of ranks of memory circuits 178 may vary. For example, in one embodiment, the memory module 176 may include at least four ranks of memory circuits 178. In another embodiment, the memory module 176 may include six ranks of memory circuits 178.

Furthermore, the first number and the second number of data pins may vary. For example, in one embodiment, the first number of data pins may be half of the second number of data pins. In another embodiment, the first number of data pins may be a third of the second number of data pins. Of course, in various embodiments the first number and the second number may be any number of data pins such that the first number of data pins is less than the second number of data pins.

In the context of the present description, a memory controller refers to any device capable of sending instructions or commands, or otherwise controlling the memory circuits 178. Additionally, in the context of the present description, a memory bus refers to any component, connection, or group of components and/or connections, used to provide electrical communication between a memory module and a memory controller. For example, in various embodiments, the memory bus 174 may include printed circuit board (PCB)

transmission lines, module connectors, component packages, sockets, and/or any other components or connections that fit the above definition.

Furthermore, the memory circuits 178 may include any type of memory device. For example, in one embodiment, the memory circuits 178 may include dynamic random access memory (DRAM). Additionally, in one embodiment, the memory module 176 may include a dual in-line memory module (DIMM).

Strictly as an option, the system 170 may include at least one buffer chip (not shown) that is in communication with the memory circuits 178 and the memory bus 174. In one embodiment, the buffer chip may be utilized to transform data signals associated with the memory bus 174. For example, the data signals may be transformed from a first data rate to a second data rate which is two times the first data rate.

Additionally, data in the data signals may be transformed from a first data width to a second data width which is half of the first data width. In one embodiment, the data signals may be associated with data transmission lines included in the memory bus 174. In this case, the memory module 176 may be connected only some of a plurality of the data transmission lines corresponding to the memory bus. In another embodiment, the memory module 176 may be configured to connect to all of the data transmission lines corresponding to the memory bus.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
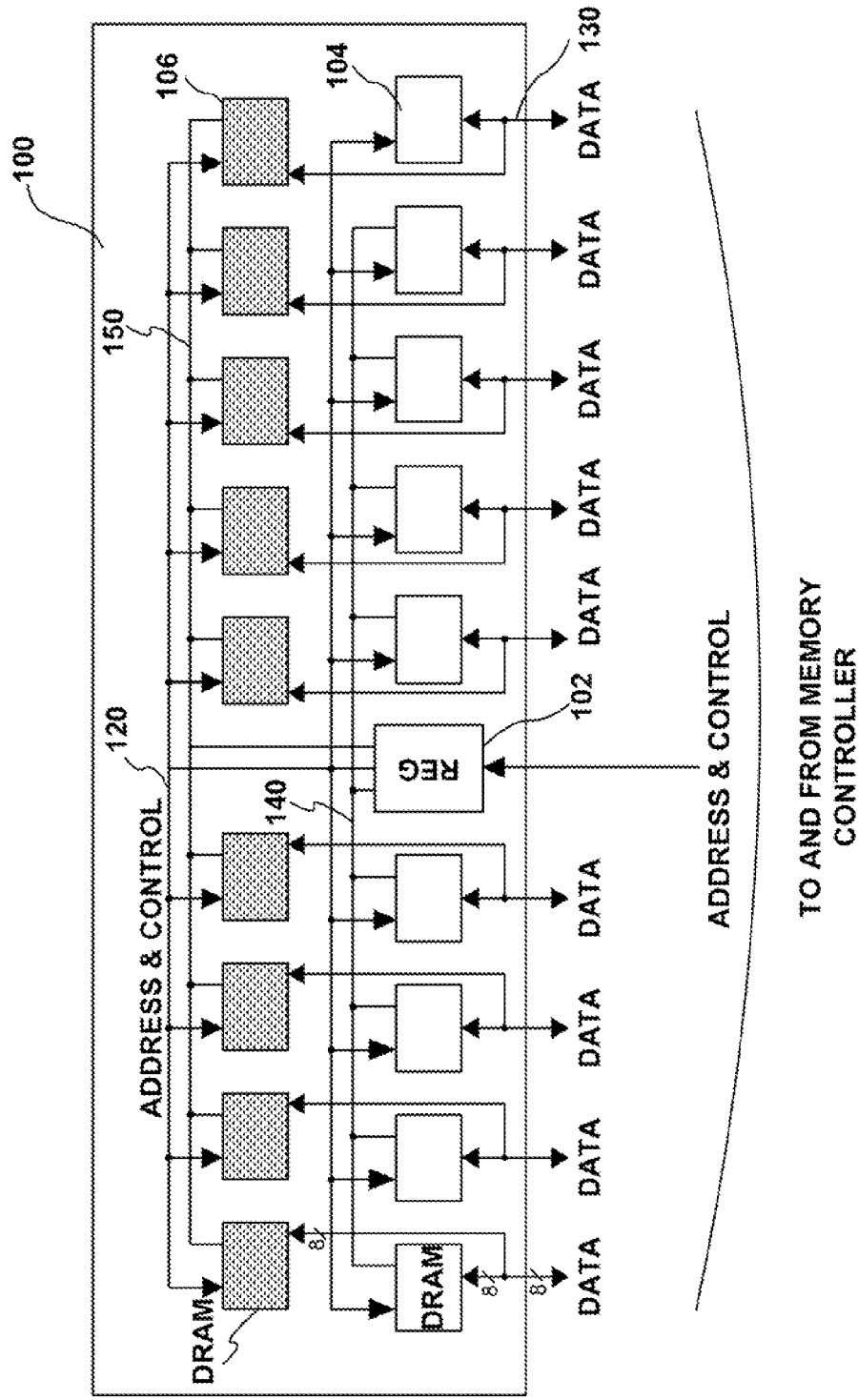
FIG. 1B illustrates a two-rank registered dual inline memory module (R-DIMM) built with 8-bit wide (×8) memory circuits, in accordance with Joint Electron Device Engineering Council (JEDEC) specifications.

FIG. 1B illustrates a two-rank registered DIMM (R-DIMM) 100 built with 8-bit wide (×8) memory (e.g. DRAM, etc.) circuits in accordance with Joint Electron Device Engineering Council (JEDEC) specifications. It should be noted that the aforementioned definitions may apply during the present description.

As shown, included are a register chip 102, and a plurality of DRAM circuits 104 and 106. The DRAM circuits 104 are positioned on one side of the R-DIMM 100 while the DRAM circuits 106 are positioned on the opposite side of the R-DIMM 100. The R-DIMM 100 may be in communication with a memory controller of an electronic host system as shown. In various embodiments, such system may be in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The DRAM circuits 104 belong to a first rank and are controlled by a common first chip select signal 140. The DRAM circuits 106 belong to a second rank and are controlled by a common second chip select signal 150. The memory controller may access the first rank by placing an address and command on the address and control lines 120 and asserting the first chip select signal 140.

Optionally, data may then be transferred between the memory controller and the DRAM circuits 104 of the first rank over the data signals 130. The data signals 130 represent all the data signals in the memory bus, and the DRAM circuits 104 connect to all of the data signals 130. In this case, the DRAM circuits 104 may provide all the data signals requested by the memory controller during a read operation to the first rank, and accept all the data signals provided by the memory controller during a write operation to the first rank. For example, the memory bus may have 72 data signals, in which case, each rank on a standard R-DIMM may have nine ×8 DRAM circuits.

The memory controller may also access the second rank by placing an address and command on the address and control lines 120 and asserting the second chip select signal 150. Optionally, data may then be transferred between the memory controller and the DRAM circuits 106 of the second rank over the data signals 130. The data signals 130 represent all the data signals in the memory bus, and the DRAM circuits 106 connect to all of the data signals 130. In this case, the DRAM circuits 106 may provide all the data signals requested by the memory controller during a read operation to the second rank, and accept all the data signals provided by the memory controller during a write operation to the second rank.

Figure 2:
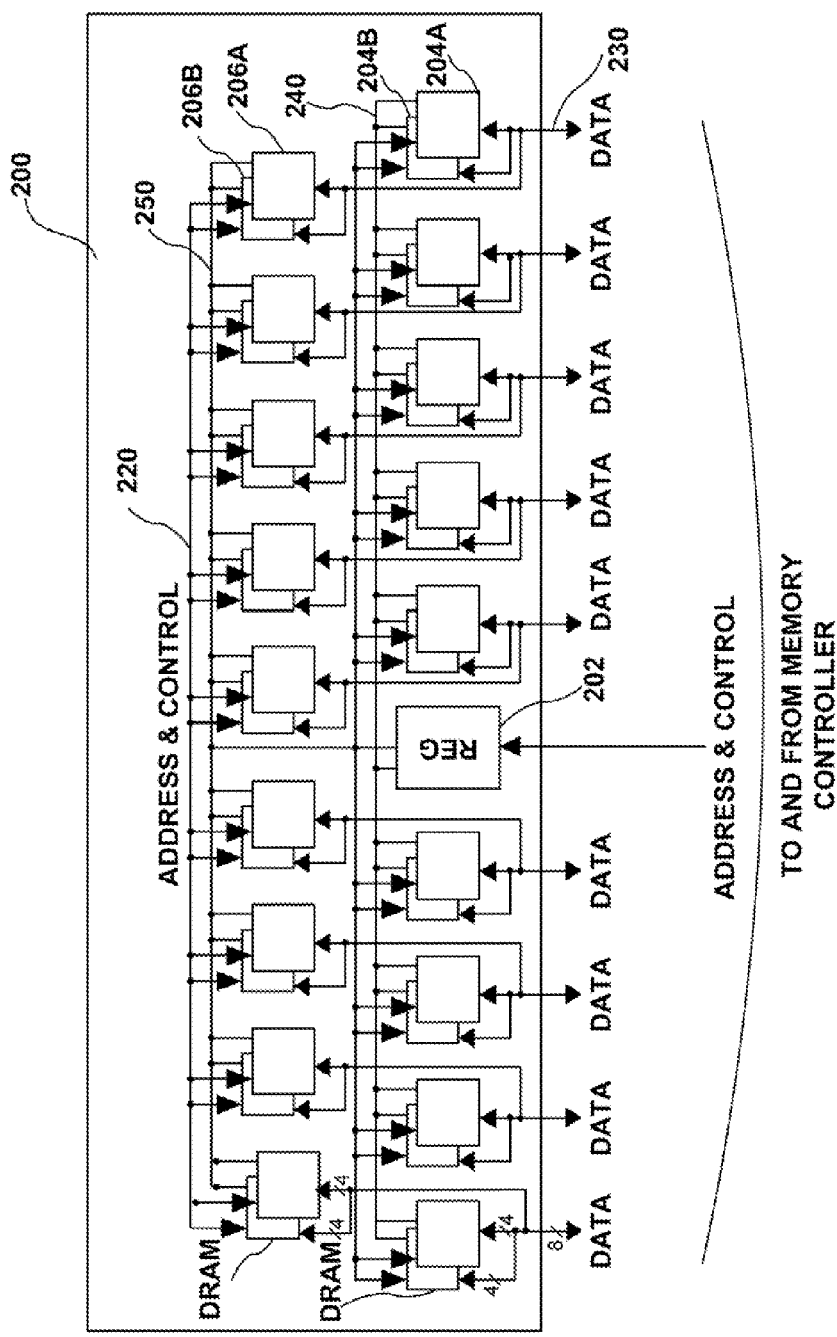
FIG. 2 illustrates a two-rank R-DIMM built with 4-bit wide (×4) dynamic random access memory (DRAM) circuits, in accordance with JEDEC specifications.

FIG. 2 illustrates a two-rank registered DIMM (R-DIMM) 200 built with 4-bit wide (×4) DRAM circuits in accordance with JEDEC specifications. Again, the aforementioned definitions may apply during the present description.

As shown, included are a register chip 202, and a plurality of DRAM circuits 204A, 204B, 206A, and 206B. The R-DIMM 200 may be in communication with a memory controller of an electronic host system as shown. The DRAM circuits 204A and 204B belong to a first rank and are controlled by a common first chip select signal 240.

In some embodiments, the DRAM circuits 204A may be positioned on one side of the R-DIMM 200 while the DRAM circuits 204B are positioned on the opposite side of the R-DIMM 200. The DRAM circuits 206A and 206B belong to a second rank and are controlled by a common second chip select signal 250. In some embodiments, the DRAM circuits 206A may be positioned on one side of the R-DIMM 200 while the DRAM circuits 206B are positioned on the opposite side of the R-DIMM 200.

In various embodiments, the DRAM circuits 204A and 206A may be stacked on top of each other, or placed next to each other on the same side of a DIMM PCB, or placed on opposite sides of the DIMM PCB in a clamshell-type arrangement. Similarly, the DRAM circuits 204B and 206B may be stacked on top of each other, or placed next to each other on the same side of the DIMM PCB, or placed on opposite sides of the board in a clamshell-type arrangement.

The memory controller may access the first rank by placing an address and command on address and control lines 220 and asserting a first chip select signal 240. Optionally, data may then be transferred between the memory controller and the DRAM circuits 204A and 204B of the first rank over the data signals 230. In this case, the data signals 230 represent all the data signals in the memory bus, and the DRAM circuits 204A and 204B connect to all of the data signals 230.

The memory controller may also access the second rank by placing an address and command on the address and control lines 220 and asserting a second chip select signal 250. Optionally, data may then be transferred between the memory controller and the DRAM circuits 206A and 206B of the second rank over the data signals 230. In this case, the data signals 230 represent all the data signals in the memory bus, and the DRAM circuits 206A and 206B connect to all of the data signals in the memory bus. For example, if the memory bus has 72 data signals, each rank of a standard R-DIMM will have eighteen ×4 DRAM circuits.

Figure 3:
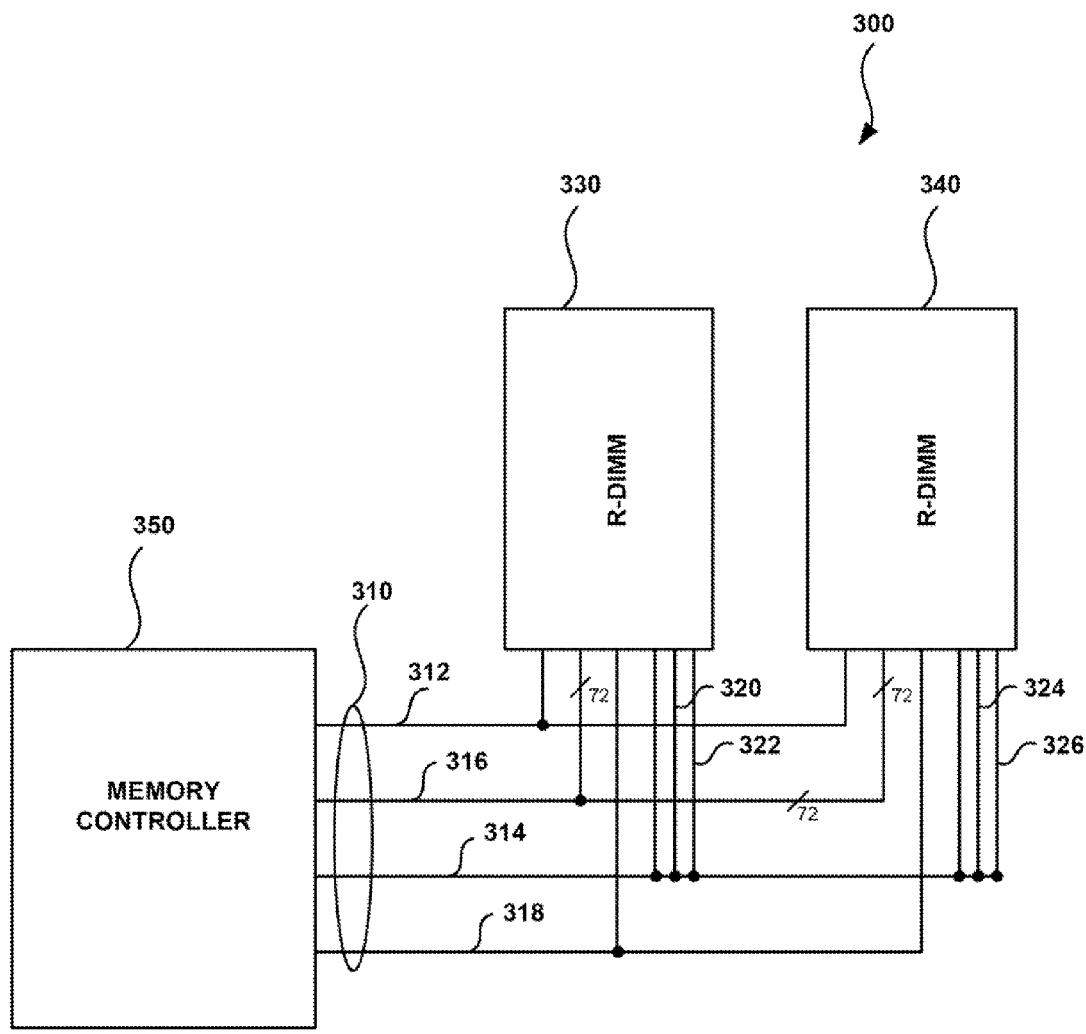
FIG. 3 illustrates an electronic host system that includes a memory controller, and two standard R-DIMMs.

FIG. 3 illustrates an electronic host system 300 that includes a memory controller 350, and two standard R-DIMMs 330 and 340. Additionally, the aforementioned definitions may apply during the present description.

As shown, a parallel memory bus 310 connects the memory controller 350 to the two standard R-DIMMs 330 and 340, each of which is a two-rank DIMM. The memory bus 310 includes an address bus 312, a control bus 314, a data bus 316, and clock signals 318. All the signals in the address bus 312 and the data bus 316 connect to both of the R-DIMMs 330 and 340 while some, but not all, of the signals in the control bus 314 connect to of the R-DIMMs 330 and 340.

The control bus 314 includes a plurality of chip select signals. The first two of these signals, 320 and 322, connect to the first R-DIMM 330, while the third and fourth chip select signals, 324 and 326, connect to the second R-DIMM 340. Thus, when the memory controller 350 accesses the first rank of DRAM circuits, it asserts chip select signal 320 and the corresponding DRAM circuits on the R-DIMM 330 respond to the access. Similarly, when the memory controller 350 wishes to access the third rank of DRAM circuits, it asserts chip select signal 324 and the corresponding DRAM circuits on the R-DIMM 340 respond to the access. In other words, each memory access involves DRAM circuits on only one R-DIMM.

However, both of the R-DIMMs 330 and 340 connect to the data bus 316 in parallel. Thus, any given access involves one source and two loads. For example, when the memory controller 350 writes data to a rank of DRAM circuits on the first R-DIMM 330, both of the R-DIMMs 330 and 340 appear as loads to the memory controller 350. Similarly, when a rank of DRAM circuits on the first R-DIMM 330 return data (e.g. in a read access) to the memory controller 350, both the memory controller 350 and the second R-DIMM 340 appear as loads to the DRAM circuits on the first R-DIMM 330 that are driving the data bus 316. Topologies that involve a source and multiple loads are typically capable of operating at lower speeds than point-to-point topologies that have one source and one load.

Figure 4:
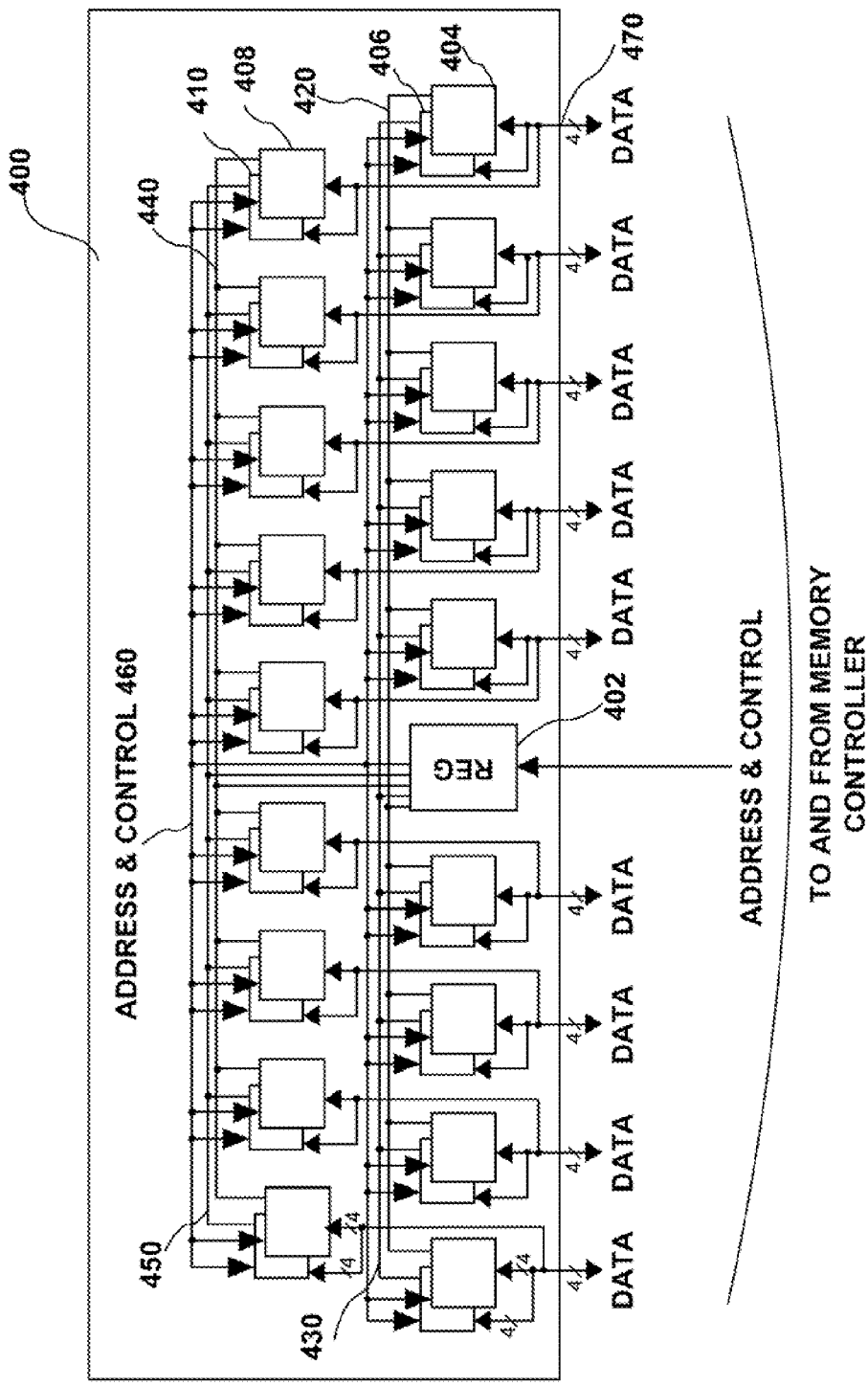
FIG. 4 illustrates a four-rank, half-width R-DIMM built using ×4 DRAM circuits, in accordance with one embodiment.

FIG. 4 illustrates a four-rank, half-width R-DIMM 400 built using ×4 DRAM circuits, in accordance with one embodiment. As an option, the R-DIMM 400 may be implemented in the context of the details of FIGS. 1-3. Of course, however, the R-DIMM 400 may be implemented in any desired environment. Again, the aforementioned definitions may apply during the present description.

As shown, included are a register chip 402, and a plurality of DRAM circuits 404, 406, 408, and 410. The DRAM circuits 404 belong to the first rank and are controlled by a common chip select signal 420. Similarly, the DRAM circuits 406 belong to the second rank and are controlled by a chip select signal 430. The DRAM circuits 408 belong to the third rank and are controlled by a chip select signal 440, while the DRAM circuits 410 belong to the fourth rank and are controlled by a chip select signal 450.

In this case, the DRAM circuits 404, 406, 408, and 410 are all ×4 DRAM circuits, and are grouped into nine sets of DRAM circuits. Each set contains one DRAM circuit from each of the four ranks. The data pins of the DRAM circuits in a set are connected to each other and to four data pins 470 of the R-DIMM 400. Since there are nine such sets, the R-DIMM 400 may connect to 36 data signals of a memory bus. In the case where a typical memory bus has 72 data signals, the R-DIMM 400 is a half-width DIMM with four ranks of DRAM circuits.

Figure 5:
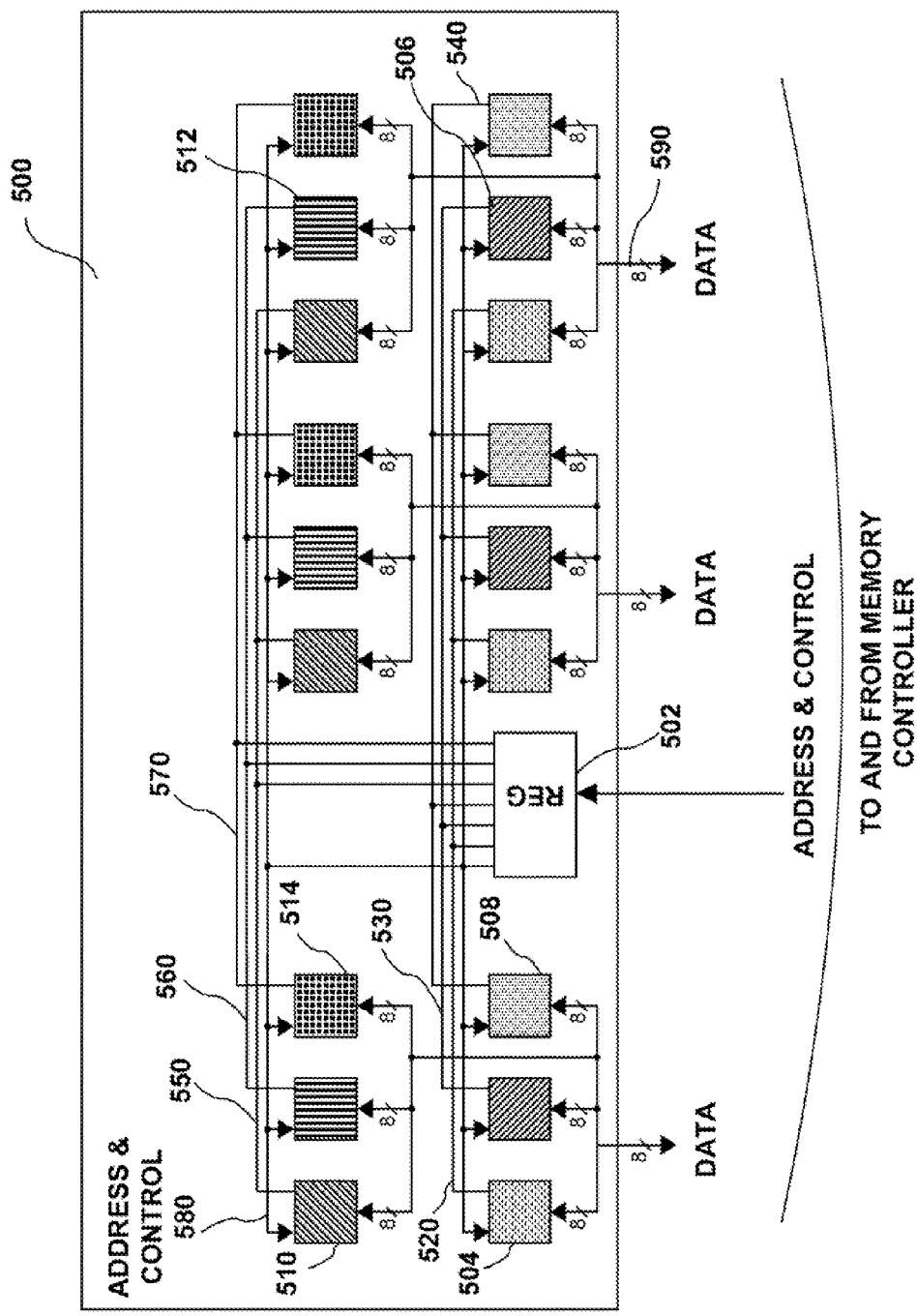
FIG. 5 illustrates a six-rank, one-third width R-DIMM built using ×8 DRAM circuits, in accordance with another embodiment.

FIG. 5 illustrates a six-rank, one-third width R-DIMM 500 built using ×8 DRAM circuits, in accordance with another embodiment. As an option, the R-DIMM 500 may be implemented in the context of the details of FIGS. 1-4. Of course, however, the R-DIMM 500 may be implemented in any desired environment. Additionally, the aforementioned definitions may apply during the present description.

As shown, included are a register chip 502, and a plurality of DRAM circuits 504, 506, 508, 510, 512, and 514. The DRAM circuits 504 belong to the first rank and are controlled by a common chip select signal 520. Similarly, the DRAM circuits 506 belong to the second rank and are controlled by a chip select signal 530. The DRAM circuits 508 belong to the third rank and are controlled by a chip select signal 540, while the DRAM circuits 510 belong to the fourth rank and are controlled by a chip select signal 550. The DRAM circuits 512 belong to the fifth rank and are controlled by a chip select signal 560. The DRAM circuits 514 belong to the sixth rank and are controlled by a chip select signal 570.

In this case, the DRAM circuits 504, 506, 508, 510, 512, and 514 are all ×8 DRAM circuits, and are grouped into three sets of DRAM circuits. Each set contains one DRAM circuit from each of the six ranks. The data pins of the DRAM circuits in a set are connected to each other and to eight data pins 590 of the R-DIMM 500. Since there are three such sets, the R-DIMM 500 may connect to 24 data signals of a memory bus. In the case where a typical memory bus has 72 data signals, the R-DIMM 500 is a one-third width DIMM with six ranks of DRAM circuits.

Figure 6:
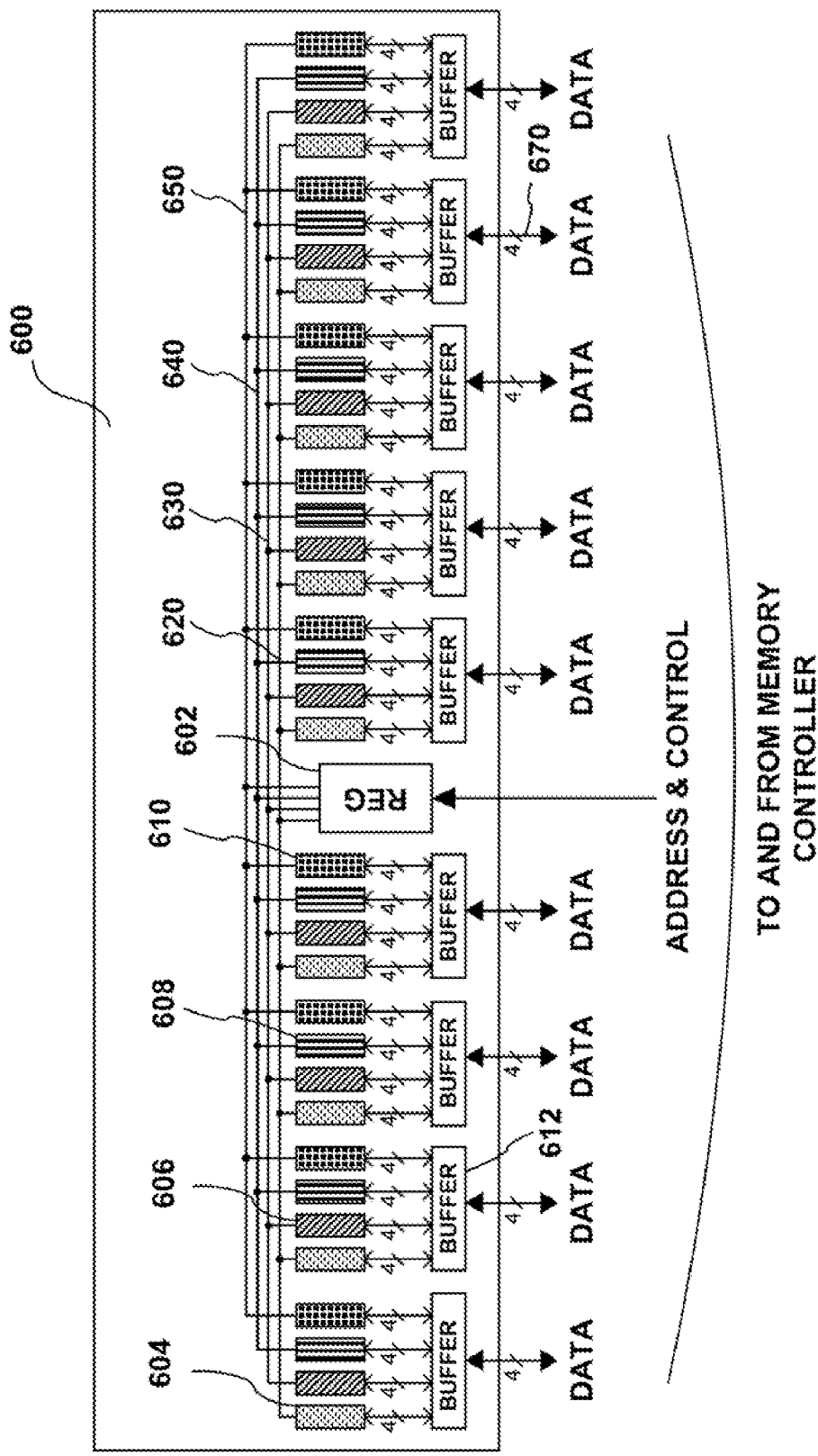
FIG. 6 illustrates a four-rank, half-width R-DIMM built using ×4 DRAM circuits and buffer circuits, in accordance with yet another embodiment.

FIG. 6 illustrates a four-rank, half-width R-DIMM 600 built using ×4 DRAM circuits and buffer circuits, in accordance with yet another embodiment. As an option, the R-DIMM 600 may be implemented in the context of the details of FIGS. 1-5. Of course, however, the R-DIMM 600 may be implemented in any desired environment. Again, the aforementioned definitions may apply during the present description.

As shown, included are a register chip 602, a plurality of DRAM circuits 604, 606, 608, and 610, and buffer circuits 612. The DRAM circuits 604 belong to the first rank and are controlled by a common chip select signal 620. Similarly, the DRAM circuits 606 belong to the second rank and are controlled by a chip select signal 630. The DRAM circuits 608 belong to the third rank and are controlled by a chip select signal 640, while the DRAM circuits 610 belong to the fourth rank and are controlled by a chip select signal 650.

In this case, the DRAM circuits 604, 606, 608, and 610 are all ×4 DRAM circuits, and are grouped into nine sets of DRAM circuits. Each set contains one DRAM circuit from each of the four ranks, and in one embodiment, the buffer chip 612. The data pins of the DRAM circuits 604, 606, 608, and 610 in a set are connected to a first set of pins of the buffer chip 612, while a second set of pins of the buffer chip 612 are connected to four data pins 670 of the R-DIMM 600. The buffer chip 612 reduces the loading of the multiple ranks of DRAM circuits on the data bus since each data pin of the R-DIMM 600 connects to only one pin of a buffer chip instead of the corresponding data pin of four DRAM circuits.

Since there are nine such sets, the R-DIMM 600 may connect to 36 data signals of a memory bus. Since a typical memory bus has 72 data signals, the R-DIMM 600 is thus a half-width DIMM with four ranks of DRAM circuits. In some embodiments, each of the DRAM circuit 604, 606, 608, and 610 may be a plurality of DRAM circuits that are emulated by the buffer chip to appear as a higher capacity virtual DRAM circuit to the memory controller with at least one aspect that is different from that of the plurality of DRAM circuits.

In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, multi-rank, partial width DIMMs. For the sake of simplicity, the address and control signals on the R-DIMM 600 are not shown in FIG. 6.

Figure 7:
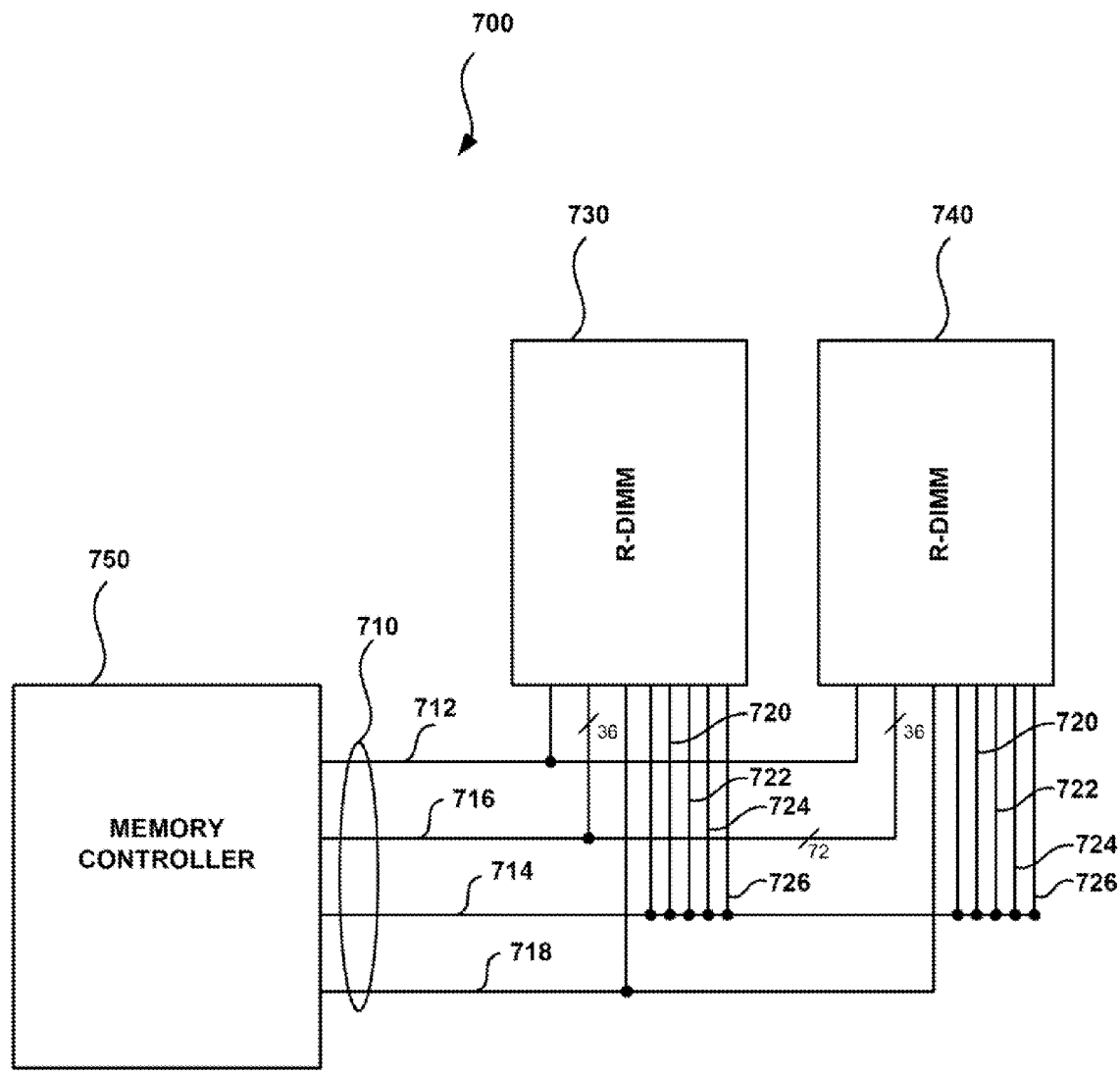
FIG. 7 illustrates an electronic host system that includes a memory controller, and two half width R-DIMMs, in accordance with another embodiment.

FIG. 7 illustrates an electronic host system 700 that includes a memory controller 750, and two half width R-DIMMs 730 and 740, in accordance with another embodiment. As an option, the electronic host system 700 may be implemented in the context of the details of FIGS. 1-6. Of course, however, the electronic host system 700 may be implemented in any desired environment. Additionally, the aforementioned definitions may apply during the present description.

As shown, a parallel memory bus 710 connects the memory controller 750 to the two half width R-DIMMs 730 and 740, each of which is a four-rank DIMM. The memory bus includes an address bus 712, a control bus 714, a data bus 716, and clock signals 718. All the signals in the address bus 712 connect to both of the R-DIMMs 730 and 740 while only half the signals in the data bus 716 connect to each R-DIMM 730 and 740. The control bus 714 includes a plurality of chip select signals.

The chip select signals corresponding to the four ranks in the system, 720, 722, 724, and 726, connect to the R-DIMM 730 and to the R-DIMM 740. Thus, when the memory controller 750 accesses the first rank of DRAM circuits, it asserts the chip select signal 720 and the corresponding DRAM circuits on the R-DIMM 730 and on the R-DIMM 740 respond to the access. For example, when the memory controller 750 performs a read access to the first rank of DRAM circuits, half the data signals are driven by DRAM circuits on the R-DIMM 730 while the other half of the data signals are driven by DRAM circuits on the R-DIMM 740.

Similarly, when the memory controller 750 wishes to access the third rank of DRAM circuits, it asserts the chip select signal 724 and the corresponding DRAM circuits on the R-DIMM 730 and the R-DIMM 740 respond to the access. In other words, each memory access involves DRAM circuits on both the R-DIMM 730 and the R-DIMM 740. Such an arrangement transforms each of the data signals in the data bus 716 into a point-to-point signal between the memory controller 750 and one R-DIMM.

It should be noted that partial width DIMMs may be compatible with systems that are configured with traditional parallel memory bus topologies. In other words, all the data signals in the data bus 716 may be connected to the connectors of both DIMMs. However, when partial width DIMMs are used, the memory circuits on each DIMM connect on only half the data signals in the data bus.

In such systems, some of the data signals in the data bus 716 may be point-to-point nets (i.e. without stubs) while other signals in the data bus 716 may have stubs. To illustrate, assume that all the signals in data bus 716 connect to the connectors of R-DIMM 730 and R-DIMM 740. When two half-width R-DIMMs are inserted into these connectors, the data signals in the data bus 716 that are driven by the DRAM circuits on the R-DIMM 740 are point-to-point nets since the memory controller 750 and the DRAM circuits on the R-DIMM 740 are located at either ends of the nets.

However, the data signals that are driven by the DRAM circuits on the R-DIMM 730 may have stubs since the DRAM circuits on the R-DIMM 730 are not located at one end of the nets. The stubs correspond to the segments of the nets between the two connectors. In some embodiments, the data signals in the data bus 716 that are driven by the DRAM circuits on the R-DIMM 730 may be terminated at the far end of the bus away from the memory controller 750. These termination resistors may be located on the motherboard, or on the R-DIMM 740, or in another suitable place.

Moreover, the data signals that are driven by the DRAM circuits on the R-DIMM 740 may also be similarly terminated in other embodiments. Of course, it is also possible to design a system that works exclusively with partial width DIMMs, in which case, each data signal in the data bus 716 connects to only one DIMM connector on the memory bus 710.

Figure 8:
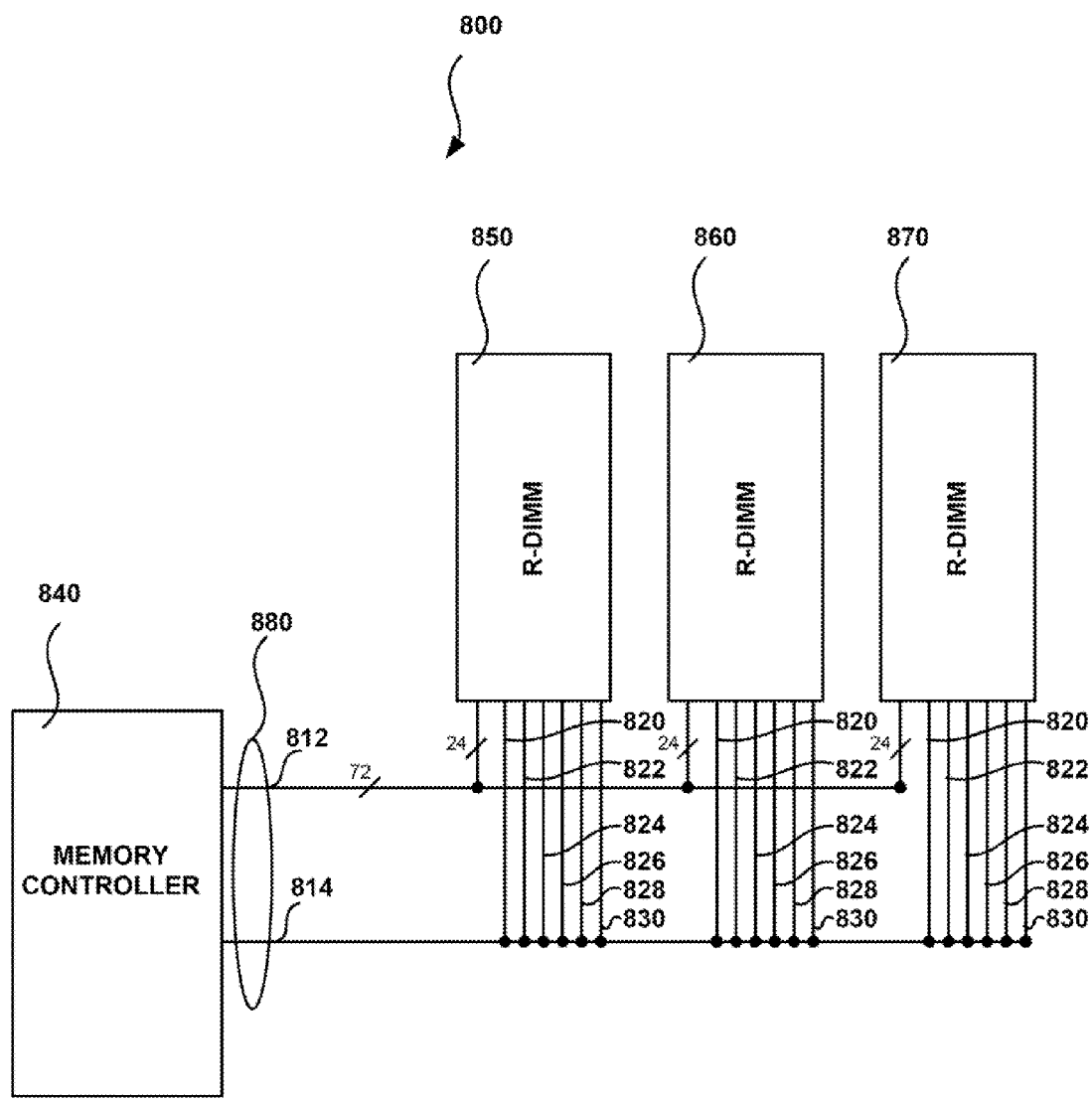
FIG. 8 illustrates an electronic host system that includes a memory controller, and three one-third width R-DIMMs, in accordance with another embodiment.

FIG. 8 illustrates an electronic host system 800 that includes a memory controller 840, and three one-third width R-DIMMs 850, 860, and 870, in accordance with another embodiment. As an option, the electronic host system 800 may be implemented in the context of the details of FIGS. 1-7. Of course, however, the electronic host system 800 may be implemented in any desired environment. Still yet, the aforementioned definitions may apply during the present description.

As shown, a parallel memory bus 880 connects the memory controller 840 to the three one-third width R-DIMMs 850, 860, and 870, each of which is a six-rank DIMM. The memory bus 880 includes an address bus (not shown), a control bus 814, a data bus 812, and clock signals (not shown). All the signals in the address bus connect to all three R-DIMMs while only one-third of the signals in the data bus 812 connect to each of the R-DIMMs 850, 860, and 870.

The control bus 814 includes a plurality of chip select signals. The chip select signals corresponding to the six ranks in the system, 820, 822, 824, 826, 828, and 830, connect to all three of the R-DIMMs 850, 860, and 870. Thus, when the memory controller 840 accesses the first rank of DRAM circuits, it asserts the chip select signal 820 and the corresponding DRAM circuits on the R-DIMM 850, on the R-DIMM 860, and on the R-DIMM 870 respond to the access.

For example, when the memory controller 840 performs a read access to the first rank of DRAM circuits, one-third of the data signals are driven by DRAM circuits on the R-DIMM 850, another one-third of the data signals are driven by DRAM circuits on the R-DIMM 860, and the remaining one-third of the data signals are driven by DRAM circuits on the R-DIMM 870. In other words, each memory access involves DRAM circuits on all three of the R-DIMMs 850, 860, and 870. Such an arrangement transforms each of the data signals in the data bus 812 into a point-to-point signal between the memory controller 840 and one R-DIMM.

In various embodiments, partial-rank, partial width, memory modules may be provided, wherein each DIMM corresponds to a part of all of the ranks in the memory bus. In other words, each DIMM connects to some but not all of the data signals in a memory bus for all of the ranks in the channel. For example, in a DDR2 memory bus with two R-DIMM slots, each R-DIMM may have two ranks and connect to all 72 data signals in the channel. Therefore, each data signal in the memory bus is connected to the memory controller and the two R-DIMMs.

For the case of the same memory bus with two multi-rank, partial width R-DIMMs, each R-DIMM may have four ranks but the first R-DIMM may connect to 36 data signals in the channel while the second R-DIMM may connect to the other 36 data signals in the channel. Thus, each of the data signal in the memory bus becomes a point-to-point connection between the memory controller and one R-DIMM, which reduces signal integrity issues and increases the maximum frequency of operation of the channel. In other embodiments, full-rank, partial width, memory modules may be built that correspond to one or more complete ranks but connect to some but not all of the data signals in the memory bus.

Figure 9:
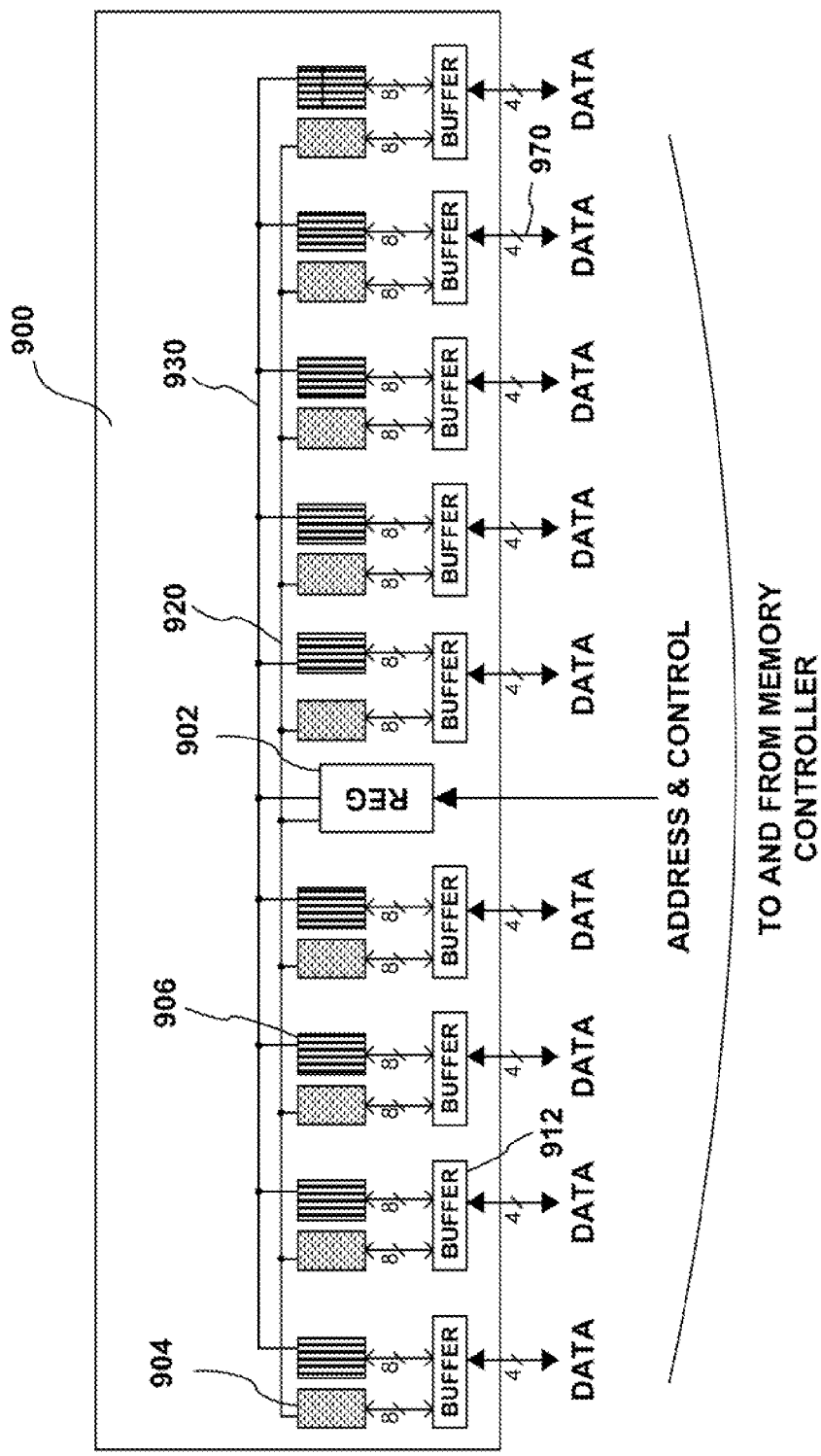
FIG. 9 illustrates a two-full-rank, half-width R-DIMM built using ×8 DRAM circuits and buffer circuits, in accordance with one embodiment.

FIG. 9 illustrates a two-full-rank, half-width R-DIMM 900 built using ×8 DRAM circuits and buffer circuits, in accordance with one embodiment. As an option, the R-DIMM 900 may be implemented in the context of the details of FIGS. 1-8. Of course, however, the R-DIMM 900 may be implemented in any desired environment. Again, the aforementioned definitions may apply during the present description.

As shown, included are a register chip 902, a plurality of DRAM circuits 904 and 906, and buffer circuits 912. The DRAM circuits 904 belong to the first rank and are controlled by a common chip select signal 920. Similarly, the DRAM circuits 906 belong to the second rank and are controlled by chip select signal 930.

The DRAM circuits 904 and 906 are all illustrated as ×8 DRAM circuits, and are grouped into nine sets of DRAM circuits. Each set contains one DRAM circuit from each of the two ranks, and in one embodiment, the buffer chip 912. The eight data pins of each of the DRAM circuits in a set are connected to a first set of pins of the buffer chip 912, while a second set of pins of the buffer chip 912 are connected to four data pins 970 of the R-DIMM 900. The buffer chip 912 acts to transform the eight data signals from each DRAM circuit operating at a specific data rate to four data signals that operate at twice the data rate and connect to the data pins of the R-DIMM, and vice versa. Since there are nine such sets, the R-DIMM 900 may connect to 36 data signals of a memory bus.

In the case that a typical memory bus has 72 data signals, the R-DIMM 900 is a half-width DIMM with two full ranks of DRAM circuits. In some embodiments, each DRAM circuit 904 and 906 may be a plurality of DRAM circuits that are emulated by the buffer chip to appear as a higher capacity virtual DRAM circuit to the memory controller with at least one aspect that is different from that of the plurality of DRAM circuits. In different embodiments, such aspect may include, for example, a number, a signal, a memory capacity, a timing, a latency, a design parameter, a logical interface, a control system, a property, a behavior (e.g. power behavior), and/or any other aspect, for that matter. Such embodiments may, for example, enable higher capacity, full-rank, partial width DIMMs. For the sake of simplicity, the address and control signals on the R-DIMM 900 are not shown in FIG. 9.

Figure 10:
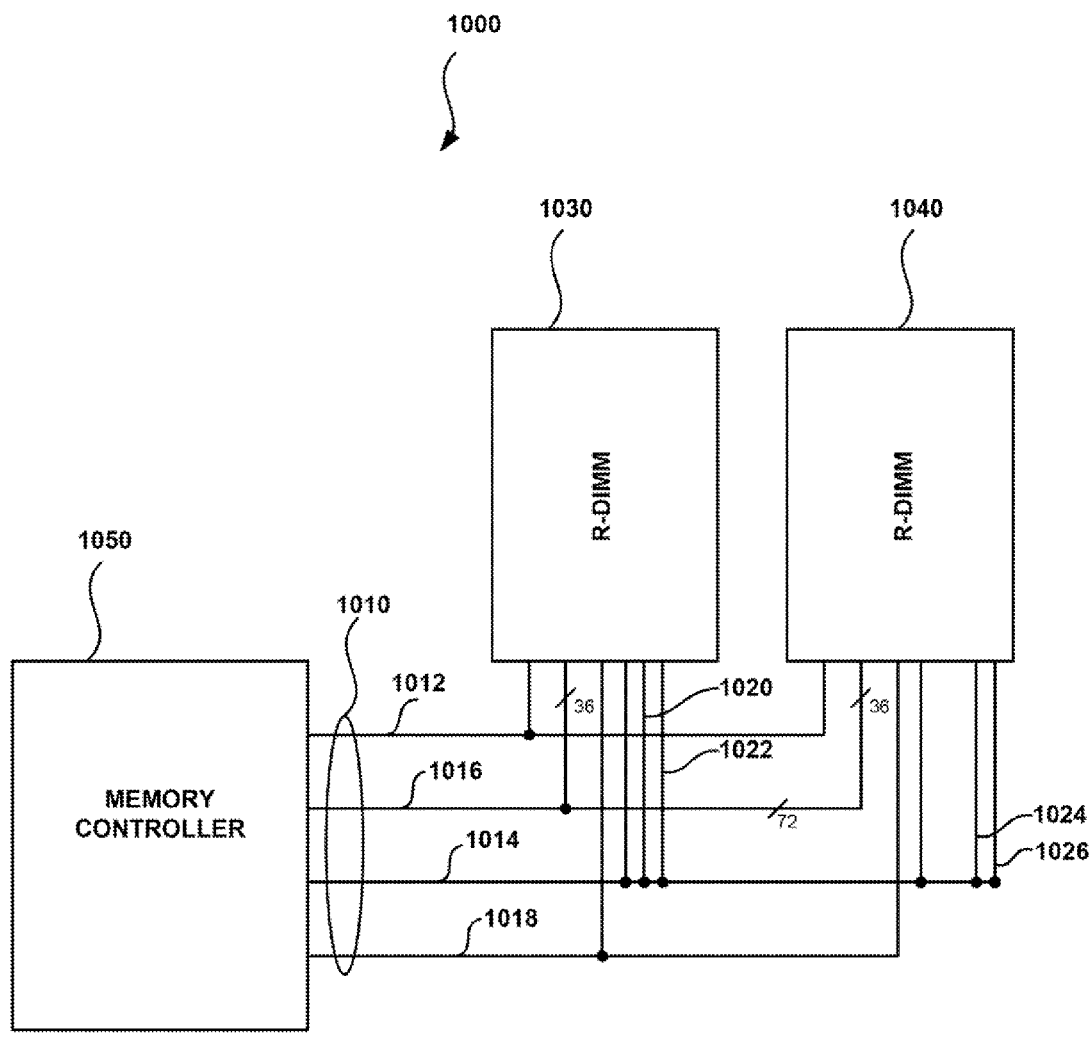
FIG. 10 illustrates an electronic host system that includes a memory controller, and two half width R-DIMMs, in accordance with one embodiment.

FIG. 10 illustrates an electronic host system 1000 that includes a memory controller 1050, and two half width R-DIMMs 1030 and 1040, in accordance with one embodiment. As an option, the electronic host system 1000 may be implemented in the context of the details of FIGS. 1-9. Of course, however, the electronic host system 1000 may be implemented in any desired environment. Additionally, the aforementioned definitions may apply during the present description.

As shown, a parallel memory bus 1010 connects the memory controller 1050 to the two half width R-DIMMs 1030 and 1040, each of which is a two-rank R-DIMM. The memory bus 1010 includes an address bus 1012, a control bus 1014, and a data bus 1016, and clock signals 1018. All the signals in the address bus 1012 connect to both of the R-DIMMs 1030 and 1040 while only half the signals in the data bus 1016 connect to each R-DIMM. The control bus 1014 includes a plurality of chip select signals.

The chip select signals corresponding to the first two ranks, 1020 and 1022, connect to the R-DIMM 1030 while chip select signals corresponding to the third and fourth ranks, 1024 and 1026, connect to the R-DIMM 1040. Thus, when the memory controller 1050 accesses the first rank of DRAM circuits, it asserts chip select signal 1020 and the corresponding DRAM circuits on the R-DIMM 1030 respond to the access.

For example, when the memory controller 1050 performs a read access to the first rank of DRAM circuits, the R-DIMM 1030 provides the entire read data on half the data signals in the data bus but at twice the operating speed of the DRAM circuits on the R-DIMM 1030. In other words, the DRAM circuits on the R-DIMM 1030 that are controlled by chip select signal 1020 will return n 72-bit wide data words at a speed of f transactions per second.

The buffer circuits on the R-DIMM 1030 will transform the read data in 2n 36-bit wide data words and drive them to the memory controller 1050 at a speed of 2f transactions per second. The memory controller 1050 will then convert the 2n 36-bit wide data words coming in at 2f transactions per second back to n 72-bit wide data words at f transactions per second. It should be noted that the remaining 36 data signal lines in the data bus 1016 that are connected to the R-DIMM 1040 are not driven during this read operation.

Similarly, when the memory controller 1050 wishes to access the third rank of DRAM circuits, it asserts chip select signal 1024 and the corresponding DRAM circuits on the R-DIMM 1040 respond to the access such that the R-DIMM 1040 sends back 2n 36-bit wide data words at a speed of 2f transactions per second. In other words, each memory access involves DRAM circuits on only one R-DIMM. Such an arrangement transforms each of the data signals in the data bus 1016 into a point-to-point signal between the memory controller 1050 and one R-DIMM.

It should be noted that full-rank, partial width DIMMs may be compatible with systems that are configured with traditional parallel memory bus topologies. In other words, all the data signals in the data bus 1016 may be connected to the connectors of both of the R-DIMMs 1030 and 1040. However, when full-rank, partial width DIMMs are used, each DIMM connects to only half the data signals in the data bus 1016. In such systems, some of the data signals in the data bus 1016 may be point-to-point nets (i.e. without stubs) while other signals in the data bus 1016 may have stubs.

To illustrate, assume that all the signals in data bus 1016 connect to the connectors of the R-DIMM 1030 and the R-DIMM 1040. When two full-rank, half-width R-DIMMs are inserted into these connectors, the data signals in the data bus that are driven by the R-DIMM 1040 are point-to-point nets since the memory controller 1050 and the buffer circuits on the R-DIMM 1040 are located at either ends of the nets. However, the data signals that are driven by the R-DIMM 1030 may have stubs since the buffer circuits on the R-DIMM 1030 are not located at one end of the nets.

The stubs correspond to the segments of the nets between the two connectors. In some embodiments, the data signals in the data bus that are driven by the R-DIMM 1030 may be terminated at the far end of the bus away from the memory controller 1050. These termination resistors may be located on the motherboard, or on the R-DIMM 1040, or in another suitable place. Moreover, the data signals that are driven by the R-DIMM 1040 may also be similarly terminated in other embodiments. Of course, it is also possible to design a system that works exclusively with full-rank, partial width DIMMs, in which case, each data signal in the data bus connects to only one DIMM connector on the memory bus.

While various embodiments have been described above, it should be understood that they have been presented by way of example only, and not limitation. For example, an un-buffered DIMM (UDIMM), a small outline DIMM (SO-DIMM), a single inline memory module (SIMM), a MiniDIMM, a very low profile (VLP) R-DIMM, etc. may be built to be multi-rank and partial width memory modules. As another example, three-rank one-third width DIMMs may be built. Further, the memory controller and optional buffer functions may be implemented in several ways. As shown here the buffer function is implemented as part of the memory module. The buffer function could also be implemented on the motherboard beside the memory controller, for example. Thus, the breadth and scope of a preferred embodiment should not be limited by any of the above-described exemplary embodiments, but should be defined only in accordance with the following claims and their equivalents.

What is claimed is:

1. An apparatus, comprising:
   a memory controller;
   a memory module including a plurality of ranks of memory circuits, wherein the memory module has a data bus width of a first number of first data pins;
   a memory bus including a second number of second data pins, wherein the first number of first data pins are fewer than the second number of second data pins, the first number of first data pins are coupled to a subset of the second number of second data pins, and the memory bus is coupled between the memory controller and the memory module; and
   at least one buffer chip that is coupled between the memory circuits and the memory bus, wherein the at least one buffer chip is configured to transform data signals of the memory bus.

2. The apparatus of claim 1, wherein the memory circuits of at least one of the ranks include physical dynamic random access memory (DRAM) circuits.

3. The apparatus of claim 1, wherein the at least one buffer chip is configured to transform the data signals from a first data rate to a second data rate that is two times the first data rate.

4. The apparatus of claim 3, wherein the at least one buffer chip is configured to transform data in the data signals from a first data width to a second data width that is half of the first data width.

5. The apparatus of claim 1, wherein the memory module includes a dual inline memory module (DIMM).

6. The apparatus of claim 5, wherein the dual inline memory module is a registered dual inline memory module (R-DIMM).

7. The apparatus of claim 1, wherein the memory module includes at least four ranks of memory circuits.

8. The apparatus of claim 1, wherein the memory module includes at least six ranks of memory circuits.

9. The apparatus of claim 1, wherein the first number is half of the second number.

10. The apparatus of claim 1, wherein the first number is one-third of the second number.

11. The apparatus of claim 1, wherein the memory module is connected to a proper subset of data transmission lines associated with the memory bus.

12. The apparatus of claim 1, wherein the at least one buffer chip is on the memory module.

13. The apparatus of claim 1, wherein the at least one buffer chip is on a motherboard.

14. The apparatus of claim 1, wherein the at least one buffer chip is configured to transform the data signals from a first data rate to a second data rate.

15. The apparatus of claim 1, wherein the at least one buffer chip is configured to transform the data signals from a first data width to a second data width.

16. The apparatus of claim 1, wherein the at least one buffer chip is configured to reduce a loading of the memory circuits on the memory bus.

17. The apparatus of claim 1, wherein the at least one buffer chip is configured to emulate memory circuits to appear to the memory controller as higher capacity virtual memory circuits with at least one aspect that is different from that of the memory circuits.

18. The apparatus of claim 17, wherein the at least one aspect includes at least one of a number, a signal, a memory capacity, a timing, a latency, a design parameter, a logical interface, a control system, a property, and a behavior.

19. The apparatus of claim 18, wherein the behavior includes a power behavior.

20. The apparatus of claim 1, wherein the memory module corresponds to a part of the plurality of ranks of memory circuits as the ranks appear to the memory bus.

21. The apparatus of claim 1, wherein the memory module corresponds to one or more complete ranks of the memory circuits as the ranks appear to the memory bus.

22. The apparatus of claim 1, further comprising:
    another memory module including a plurality of ranks of memory circuits, wherein the other memory module has a data bus width of a third number of data pins, the third number of data pins being fewer than the second number of data pins;
    wherein the memory bus is coupled between the memory controller and the memory circuits of the memory modules.

23. The apparatus of claim 22, wherein a sum of the first number of data pins and the third number of data pins equals the second number of data pins.

24. The apparatus of claim 23, wherein the first number of data pins equals the third number of data pins.

25. An apparatus, comprising:
    a memory controller;
    a memory module including a plurality of ranks of memory circuits, wherein the memory module has a data bus width of a first number of first data pins;
    a memory bus including a second number of second data pins, wherein the first number of first data pins are fewer than the second number of second data pins, the first number of first data pins are coupled to a subset of the second number of second data pins, and the memory bus is coupled between the memory controller and the memory module; and
    at least one buffer chip coupled between the memory circuits and the memory bus;
    wherein the at least one buffer chip is configured to emulate at least one of the memory circuits to appear different to the memory controller in at least one aspect from the at least one of the memory circuits.

26. The apparatus of claim 25, wherein the at least one aspect includes at least one of a memory capacity, a timing, a latency, and a power behavior.

27. An apparatus, comprising:
    a memory controller;
    a memory module including a plurality of ranks of memory circuits, wherein the memory module has a data bus width of a first number of first data pins;
    a memory bus including a second number of second data pins, wherein the first number of first data pins are fewer than the second number of second data pins, the first number of first data pins are coupled to a subset of the second number of second data pins, and the memory bus is coupled between the memory controller and the memory module; and at least one buffer chip that is coupled between the memory circuits and the memory bus;

wherein the at least one buffer chip is configured to emulate at least one of the memory circuits to appear to the memory controller as a higher capacity virtual dynamic random access memory (DRAM) circuit.

28. An apparatus, comprising:

a memory controller;

a memory module including a plurality of ranks of memory circuits, wherein the memory module has a data bus width of a first number of first data pins;

a memory bus including a second number of second data pins, wherein the first number of first data pins are fewer than the second number of second data pins, the first number of first data pins are coupled to a subset of the second number of second data pins, and the memory bus is coupled between the memory controller and the memory module; and at least one buffer chip that is coupled between the memory circuits and the memory bus;

wherein each data pin of the memory module is coupled to a single pin of the at least one buffer chip.

29. The apparatus of claim 28, wherein the coupling of the memory module to the at least one buffer chip is configured to reduce loading of the ranks of memory circuits.

30. A sub-system, comprising:

a memory module including a plurality of ranks of memory circuits, wherein the memory module has a data bus width of a first number of first data pins, the memory module is configured to be coupled to a memory bus, the memory bus including a second number of second data pins, wherein the first number of first data pins are fewer than the second number of second data pins, and the first number of first data pins are coupled to a subset of the second number of second data pins;

wherein the memory module further includes at least one buffer chip that is coupled between the memory circuits and the memory bus, and the at least one buffer chip is configured to transform data signals of the memory bus.

* * * * *